US008184824B2

(12) United States Patent
Hettinger et al.

(10) Patent No.: US 8,184,824 B2
(45) Date of Patent: May 22, 2012

(54) DIFFERENTIATED AUDIO

(75) Inventors: Mark Hettinger, Reno, NV (US);
Jamal Benbrahim, Reno, NV (US);
Scott Boyd, Las Vegas, NV (US)

(73) Assignee: IGT, Reno, NV (US)

( * ) Notice: Subject to any disclaimer, the term of this patent is extended or adjusted under 35 U.S.C. 154(b) by 1206 days.

(21) Appl. No.: 11/585,409

(22) Filed: Oct. 23, 2006

(65) Prior Publication Data

US 2007/0036368 A1      Feb. 15, 2007

Related U.S. Application Data

(63) Continuation-in-part of application No. 11/239,554, filed on Sep. 28, 2005, which is a continuation of application No. 10/387,180, filed on Mar. 11, 2003, now Pat. No. 6,968,063.

(51) Int. Cl.
*H04B 3/00*              (2006.01)

(52) U.S. Cl. ............ 381/77; 381/388; 381/302; 463/20; 463/35

(58) Field of Classification Search .................... 381/17, 381/77, 382, 25, 27, 57, 107, 61–63, 1, 18, 381/300, 303, 307, 309, 310, 74; 435/20, 435/35; 463/47, 25, 20, 35–37; 273/317.1, 273/461; 725/38, 40, 133, 141, 153
See application file for complete search history.

(56) References Cited

U.S. PATENT DOCUMENTS

| | | |
|---|---|---|
| 1,661,135 A | 2/1928 | Knight |
| 4,455,675 A | 6/1984 | Bose et al. |
| 4,628,526 A | 12/1986 | Germer |
| 4,644,581 A | 2/1987 | Sapiejewski |
| 5,070,527 A | 12/1991 | Lynn |
| 5,077,799 A | 12/1991 | Cotton |
| 5,208,866 A | 5/1993 | Kato et al. |

(Continued)

FOREIGN PATENT DOCUMENTS

EP          0552368         7/1993
(Continued)

OTHER PUBLICATIONS

Search Report dated Jul. 9, 2004; App. #GB0403015.1.

(Continued)

*Primary Examiner* — Vivian Chin
*Assistant Examiner* — Leshui Zhang
(74) *Attorney, Agent, or Firm* — Weaver Austin Villeneuve & Sampson LLP

(57) ABSTRACT

The present invention provides novel methods and devices for providing audio to players of a gaming machine and to nearby players. According to preferred implementations, sounds intended for a person currently using a gaming machine are distinguished from second sounds intended for persons who are not currently using the gaming machine. The former sounds are directed to the player of the gaming machine by one or more methods and/or devices. For example, the gaming machine may include a device for producing ultrasonic waves (e.g., in a beam) that produce the first sounds via interaction with a medium, a sound dome, a speaker array, or other devices for producing directional sound. The sound may be directed to a predetermined area near the gaming machine. Alternatively, the sound may be directed to an area at or near where the player is detected to be, where the player's player tracking card is detected to be, etc.

28 Claims, 20 Drawing Sheets

U.S. PATENT DOCUMENTS

| | | | |
|---|---|---|---|
| 5,450,494 A | 9/1995 | Okubo et al. | |
| 5,530,761 A | 6/1996 | d' Alayer de Costemore d' Arc | |
| 5,633,993 A * | 5/1997 | Redmann et al. | 345/419 |
| 5,666,426 A | 9/1997 | Helms | |
| 5,778,077 A | 7/1998 | Davidson | |
| 5,907,823 A | 5/1999 | Sjoberg et al. | |
| 6,005,642 A * | 12/1999 | Meisner et al. | 348/838 |
| 6,016,351 A | 1/2000 | Raida et al. | |
| 6,091,826 A | 7/2000 | Laitinen et al. | |
| 6,360,187 B1 | 3/2002 | Hermann | |
| 6,561,908 B1 | 5/2003 | Hoke | |
| 6,638,169 B2 | 10/2003 | Wilder et al. | |
| 6,739,973 B1 | 5/2004 | Lucchesi et al. | |
| 6,805,633 B2 | 10/2004 | Hein, Jr. et al. | |
| 6,968,063 B2 | 11/2005 | Boyd | |
| 7,225,414 B1 * | 5/2007 | Sharma et al. | 715/863 |
| 7,364,508 B2 | 4/2008 | Loose et al. | |
| 2003/0064804 A1 * | 4/2003 | Wilder et al. | 463/35 |
| 2003/0114214 A1 | 6/2003 | Barahona et al. | |
| 2003/0119575 A1 | 6/2003 | Centuori et al. | |
| 2004/0029637 A1 * | 2/2004 | Hein et al. | 463/35 |
| 2004/0162129 A1 | 8/2004 | Nelson | |
| 2004/0179701 A1 | 9/2004 | Boyd | |
| 2005/0288083 A1 * | 12/2005 | Downs | 463/11 |
| 2006/0029232 A1 | 2/2006 | Boyd | |
| 2006/0140420 A1 * | 6/2006 | Machida | 381/116 |
| 2006/0262935 A1 * | 11/2006 | Goose et al. | 381/17 |

FOREIGN PATENT DOCUMENTS

| | | |
|---|---|---|
| EP | 0600164 A1 | 6/1994 |
| EP | 0610570 | 8/1994 |
| EP | 1067682 A2 | 1/2001 |
| EP | 1067682 A3 | 10/2003 |
| FR | 1517088 | 3/1968 |
| GB | 2115987 | 9/1983 |
| GB | 2124048 A | 2/1984 |
| GB | 2124048 A | 8/1984 |
| GB | 2399469 | 8/2006 |
| GB | 2419753 | 8/2006 |
| JP | 04136999 A | 5/1992 |
| JP | 4136999 A | 5/1992 |
| JP | 4167024 A | 6/1992 |
| JP | 04167024 A | 6/1992 |
| ZA | 2004/1110 | 8/2005 |

OTHER PUBLICATIONS

Examination Opinion dated Jul. 12, 2004; App.#GB0403015.1.
Abbreviated Examination Report dated Jun. 30, 2005; App. # GB0403015.1.
Examination Report dated Sep. 9, 2005; App#GB0403015.1.
Search Report dated Feb. 21, 2006; App#GB0601017.7.
Examination Report dated Feb. 22, 2006; App#GB0403015.1.
Combined Search and Examination Report dated Feb. 22, 2006; App#GB0601017.7.
US Notice of Allowance dated Jun. 29, 2005, from U.S. Appl. No. 10/387,180.
US Office Action dated Aug. 30, 2004, from U.S. Appl. No. 10/387,180.
US Office Action dated Jun. 8, 2009, from U.S. Appl. No. 11/239,554.
US Office Action dated Jan. 21, 2010, from U.S. Appl. No. 11/239,554.
US Office Action dated Jun. 14, 2010, from U.S. Appl. No. 11/239,554.
AU Examination Report dated Sep. 9, 2008, in Application No. 2004200556.

* cited by examiner

DIFFERENTIATED AUDIO

CROSS-REFERENCE TO RELATED APPLICATIONS

This application is a continuation-in-part of U.S. patent application Ser. No. 11/239,554, entitled "Dynamic Volume Adjustment in a Slot Machine" and filed on Sep. 28, 2005, which is a continuation of U.S. patent application Ser. No. 10/387,180, entitled "Dynamic Volume Adjustment in a Slot Machine" and filed on Mar. 11, 2003, now U.S. Pat. No. 6,968,063, both of which are hereby incorporated by reference in their entirety and for all purposes.

BACKGROUND OF THE INVENTION

Sound is an important way to communicate information to a player in a casino. For example, sound can be used to attract a player to a game and to communicate information about how to play the game, paytable information, etc. Sounds can be used to prompt the player to perform certain tasks, to celebrate winning events, and to announce winning events to nearby players.

Accordingly, sounds produced by a gaming machine may be for the intended benefit of different "audiences." Some types of sounds produced by a gaming machine are intended for the person playing that gaming machine, whereas other sounds produced by the gaming machine are intended to be heard by other people. Still other sounds produced by the gaming machine are intended to be heard not only by the person playing that gaming machine, but also by other people.

One drawback to using sound as part of gaming machine operation is sound volume regulation. The ambient noise level in a casino varies greatly throughout the day. At peak times, a casino is quite loud. At off-peak times, however, a casino is relatively quiet.

The dynamic range of the ambient noise level creates a problem for game designers wishing to fully utilize sounds to communicate with players. If a gaming machine's volume is set high enough to be heard in the casino during peak times, it will be unpleasantly loud during non-peak times. The off-peak "hyper-volume" problem is sufficiently disturbing that casino personnel reduce the volume on sound-generating gaming machines.

Further, the volume of sounds produced by conventional casino gaming machines cannot be altered by a player. Manual downward volume adjustment by casino personnel during non-peak casino periods is time-consuming. Subsequent adjustment is required as the casino business again increases.

During peak times, people in a gaming establishment are subjected to high-volume sounds, most of which are not intended for the person hearing the sounds. Moreover, some game designers have been known to minimize the use of sounds because of the foregoing issues. Accordingly, if such sound-related problems were resolved, gaming machine sounds could be used more effectively and extensively.

SUMMARY OF THE INVENTION

The present invention provides novel methods and devices for providing audio to players of a gaming machine and to others in a gaming establishment. According to preferred implementations, sounds intended for a person currently using a gaming machine are distinguished from second sounds intended for persons who are not currently using the gaming machine. The former sounds are directed to the player of the gaming machine by one or more methods and/or devices. For example, the gaming machine may include a device for producing ultrasonic waves (e.g., in a beam) that produce the first sounds via interaction with a medium, a sound dome, a speaker array, or other devices for producing directional sound. The sound may be directed to a predetermined area near the gaming machine. Alternatively, the sound may be directed to an area where the player is detected to be.

Some implementations of the invention involve a gaming method that includes the following steps: differentiating first sounds intended for a first person currently using a gaming machine from second sounds intended for second persons who are not currently using the gaming machine; reproducing the first sounds and the second sounds; and directing the first sounds to a first area near one or more input devices of the gaming machine such that within the first area, a first volume of the first sounds is higher than a second volume of the second sounds.

For example, the first sounds may comprise instruction sounds and the second sounds may comprise attraction sounds. However, the first sounds and second sounds may be other types of sounds. For example, the second sounds may comprise game-winning sounds, bonus-related sounds, jackpot sounds, or the like. Outside of the first area, the second volume may or may not be higher than the first volume.

The gaming method may also involve differentiating third sounds from the second sounds and the first sounds, wherein the third sounds are equally intended for the first person and the second persons. The third sounds may, for example, comprise game-winning sounds, bonus-related sounds, jackpot sounds, or the like. The third sounds may be reproduced such that the volume of third sounds is not substantially different inside or outside the first area.

The gaming method may also involve detecting an ambient noise level. The gaming method may also involve modulating the volume of first, second and/or third sounds according to the ambient noise level.

The methods described herein may be implemented, at least in part, by software, hardware and/or firmware of a gaming machine and/or devices in communication with, or located near, a gaming machine. For example, some embodiments of the invention are provided, at least in part, by a gaming machine. The gaming machine includes one or more devices configured to do the following: differentiate first sounds intended for a first person currently using a gaming machine from second sounds intended for second persons who are not currently using the gaming machine; reproduce the first sounds and the second sounds; and direct the first sounds to a first area near one or more user interfaces of the gaming machine such that within the first area. The first volume of the first sounds may be higher than a second volume of the second sounds.

The gaming machine may also include the following elements: an ambient noise level detector configured to detect an ambient noise level and to produce a detected ambient noise level signal; and a dynamic volume controller configured to regulate a first volume of the first sounds in response to a detected ambient noise level signal. The dynamic volume controller may be configured to regulate a second volume of the second sounds in response to the detected ambient noise level signal.

The reproducing device(s) may include a device for producing ultrasonic waves that make the first sounds via interaction with a medium. For example, the reproducing device(s) may include a device configured to form a beam of ultrasonic waves that produces the first sounds via interaction with a medium. A reproducing device may comprise a sound dome. The reproducing device(s) may comprise a speaker array.

The differentiating device(s) may be configured to differentiate third sounds from the second sounds and the first sounds, the third sounds being equally intended for the first person and the second persons. The gaming machine may be configured to control the reproducing device(s) to reproduce the third sounds such that a volume of the third sounds is not substantially different inside or outside the first area.

Some aspects of the invention are implemented via a gaming apparatus. The gaming apparatus may be, or may at least include, an electronic gaming machine. However, some features of the gaming apparatus may be provided by other devices that are near, and/or in communication with, an electronic gaming machine. For example, some detecting devices, directional audio devices, etc., may be associated with a gaming machine and/or disposed near a gaming machine, but are not necessarily part of the gaming machine.

One such gaming apparatus includes the following elements: a directional audio device; one or more detecting devices for detecting a location of a person; means for controlling the directional audio device to direct sounds to the location; and means for providing a wagering game. The sounds may, for example, comprise attraction sounds relating to the wagering game.

The detecting device(s) may comprise a radio frequency identification ("RFID") reader. If so, the controlling means may control the directional audio device to direct the sounds towards the location of an RFID tag read by the RFID reader. The sounds may comprise a personalized message directed to a person associated with the RFID tag.

Other types of gaming devices are provided by the present invention. One such gaming device is configured for providing a wagering game. The gaming device also includes a first transmitter for transmitting first attraction messages at a first frequency and a second transmitter for transmitting second attraction messages at a second frequency. The first and second attraction messages may, for example, correspond with first and second levels of a player tracking program.

These and other features of the present invention will be presented in more detail in the following detailed description of the invention and the associated figures.

DESCRIPTION OF THE PREFERRED EMBODIMENTS

Figure 1:
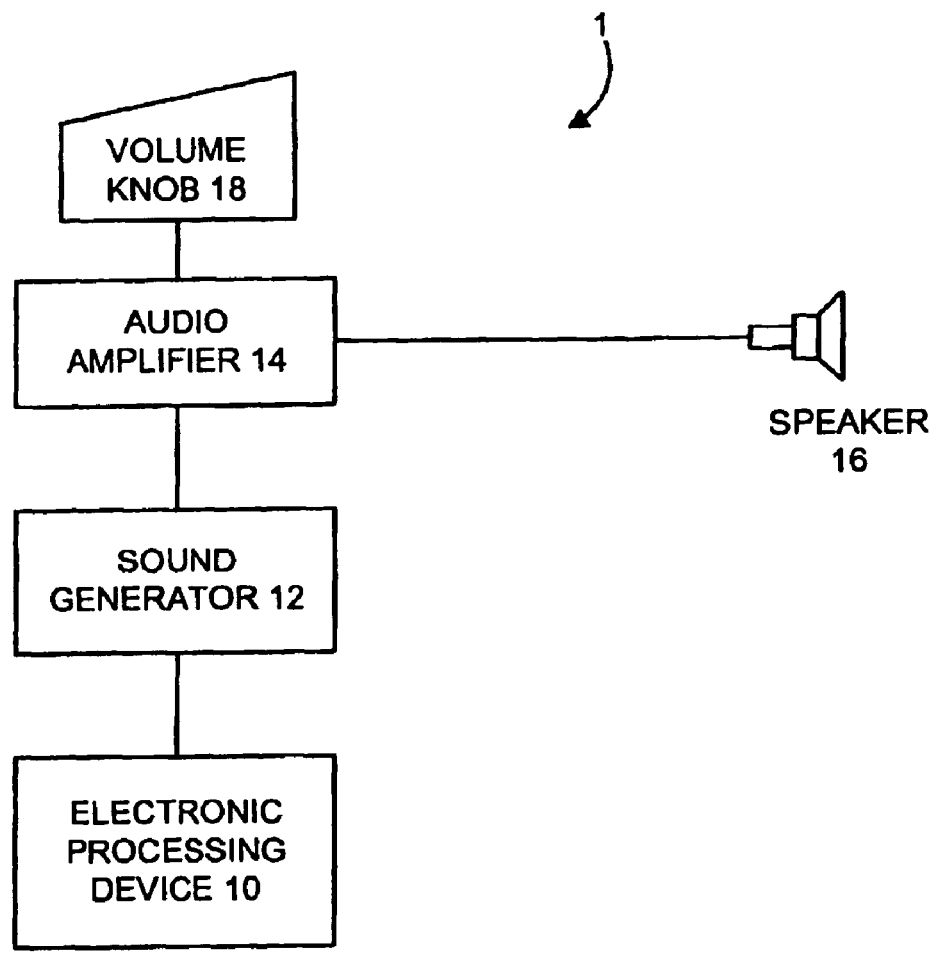
FIG. 1 is a diagram of a gaming machine of the prior art.

In this application, numerous specific details are set forth in order to provide a thorough understanding of the present invention. It will be obvious, however, to one skilled in the art, that the present invention may be practiced without some or all of these specific details. In other instances, well known process steps have not been described in detail in order not to obscure the present invention. Moreover, the steps of at least some of the methods described herein are not necessarily performed in the order indicated.

The present invention provides novel methods and devices for providing audio to players of a gaming machine and/or to nearby players. According to preferred implementations, sounds that are primarily intended to be heard by a person currently using a gaming machine are distinguished from second sounds that are primarily intended for persons who are not currently using the gaming machine. Various other sounds may be distinguished that are intended to be heard by a person currently using a gaming machine as well as by other people.

Sounds that are intended to be heard by a person currently using a gaming machine may be directed to the player of the gaming machine by one or more methods and/or devices. For example, the gaming machine may include a device for producing ultrasonic waves (e.g., in a beam) that produce the first sounds via interaction with a medium, a sound dome, a speaker array, or other devices for producing directional sound. The sound may be directed to a predetermined area near the gaming machine. Alternatively, the sound may be directed to an area where the player is detected to be, where the player's radio frequency identification card is detected to be, etc.

In some implementations of the invention, personalized audio messages may be directed to a specific person that is identified, at least in part, by a gaming machine. For example, the gaming machine may include a device for reading a player tracking card that contains information by which a player may be identified. The identification process may involve not only the gaming machine, but also other networked devices such as cameras, biometric devices (e.g., retinal scanners, fingerprint readers, etc.), RFID readers, servers and network storage devices.

In some implementations of the invention, an RFID reader that is associated with a gaming machine will be configured to read an RFID tag that is affixed to a player's card or another such means of identification. Information on the RFID tag may directly identify a person and/or may be used to access stored information regarding that person. The stored information may, for example, be determined from a database of a player tracking program or another database with relevant and/or customized information. Accordingly, a personalized message may be based on such information and directed to the person.

The present disclosure also provides a system for detecting an ambient noise level adjacent a gaming machine and adjusting the sound output of the gaming machine in relation to the ambient noise level.

Casino gaming machine 1, shown in FIG. 1, generally includes electronic processor 10 programmed to operate a casino game. Sound generator 12 generates a gaming sound pre-amp signal, which is delivered to audio amplifier 14 for amplification and transmission to one or more speakers 16.

Further, these audio outputs have a constant volume for all sounds. Manual volume control 18 can be employed to adjust the sound level of gaming machine 1.

Figure 2:
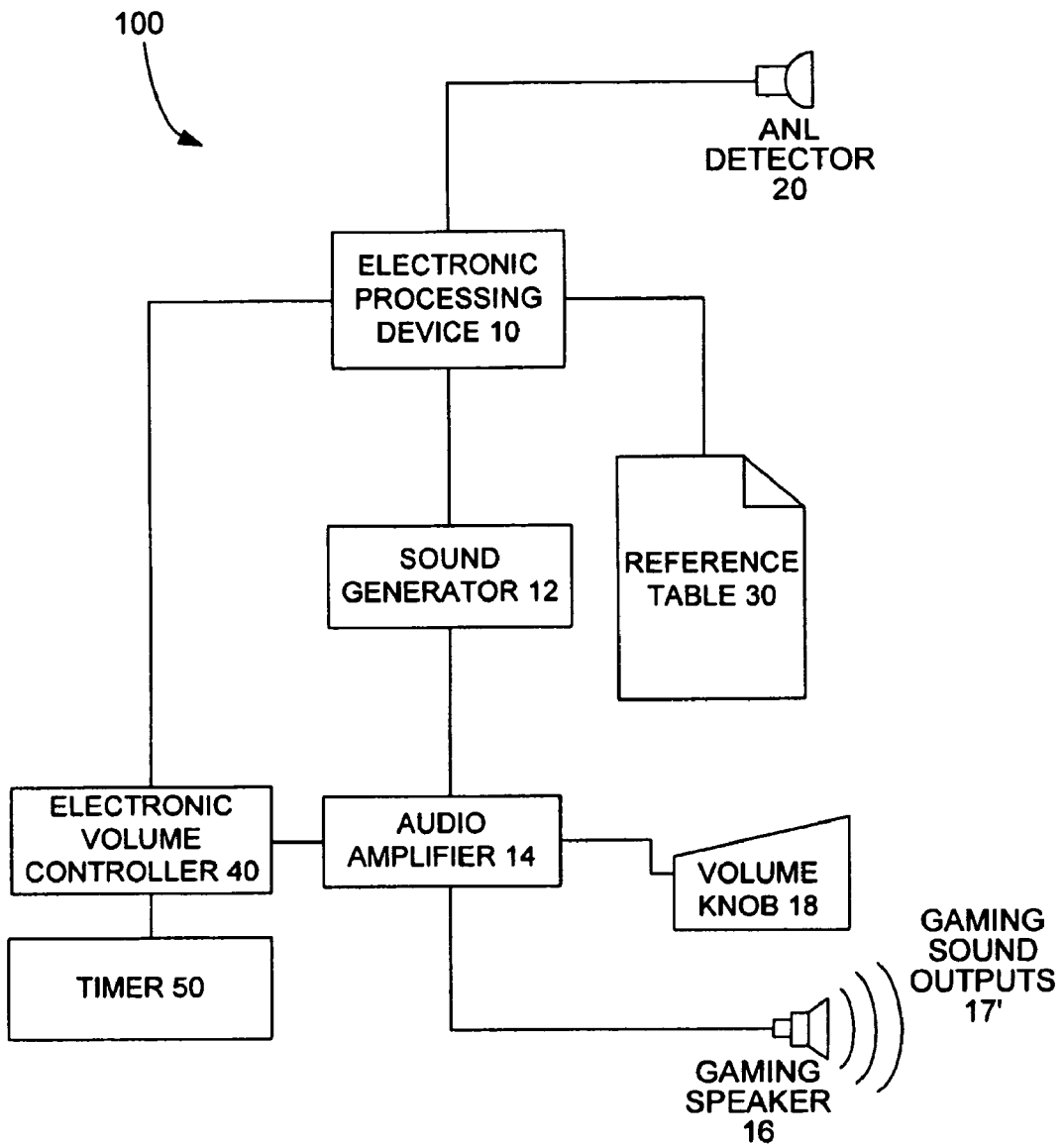
FIG. 2 is a diagram of a casino gaming machine in accordance with some aspects of the present disclosure, having a volume adjustment system therein.
Figure 5:
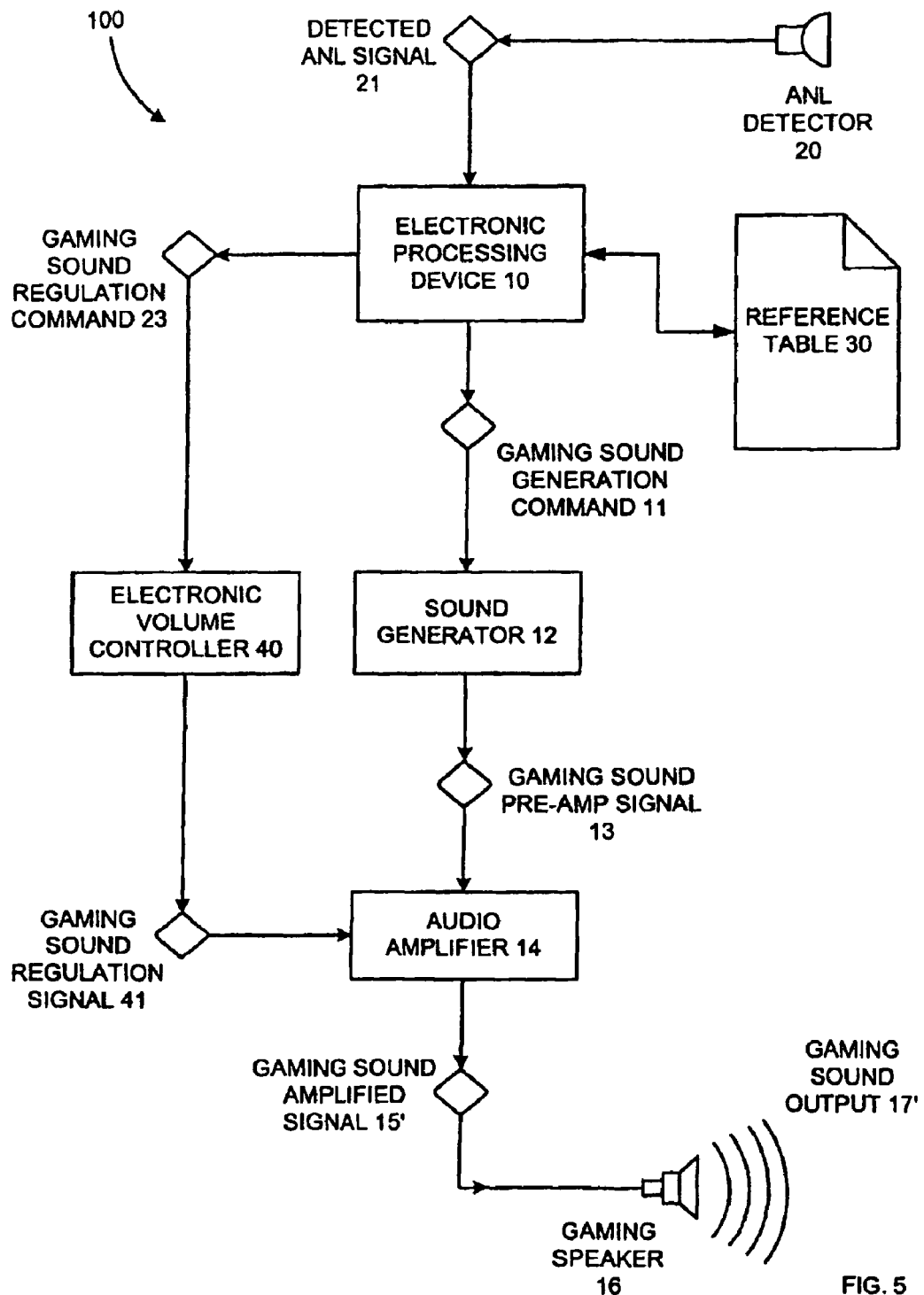
FIG. 5 is a diagram of the embodiment of FIG. 2, showing the flow of signals.

Turning to FIG. 2, a gaming machine 100 in accordance with the present disclosure includes electronic processor 10 structured to operate a casino game. In response to a gaming sound generation command 11, sound generator 12 is structured to produce a gaming sound pre-amp signal 13 for communication audio amplifier 14. Audio amplifier 14 generates a corresponding gaming sound amplified signal 15 having an amplification level. The gaming sound amplified signal 15 is received by speaker 16 and emitted as a gaming sound output 17 (FIG. 5) audible to a player or passerby.

Ambient noise level detector 20 is structured to detect an ambient noise level near gaming machine 100. Ambient noise level detector 20 can be a microphone or other device that detects a sound level. The sensitivity of ambient noise level detector 20 can be set, allowing an operator to detect an ambient noise level of a definable space (or environment) adjacent gaming machine 100. For example, ambient noise level detector 20 can be structured to detect an ambient noise level adjacent the player at gaming machine 100. Alternatively, ambient noise level detector 20 can be set to detect an ambient noise level of a defined area around gaming machine 100. The breadth of the detectable ambient noise environment surrounding gaming machine 100 can be programmed into electronic processor 10 or, alternatively, can be defined by a machine operator.

Figure 3:
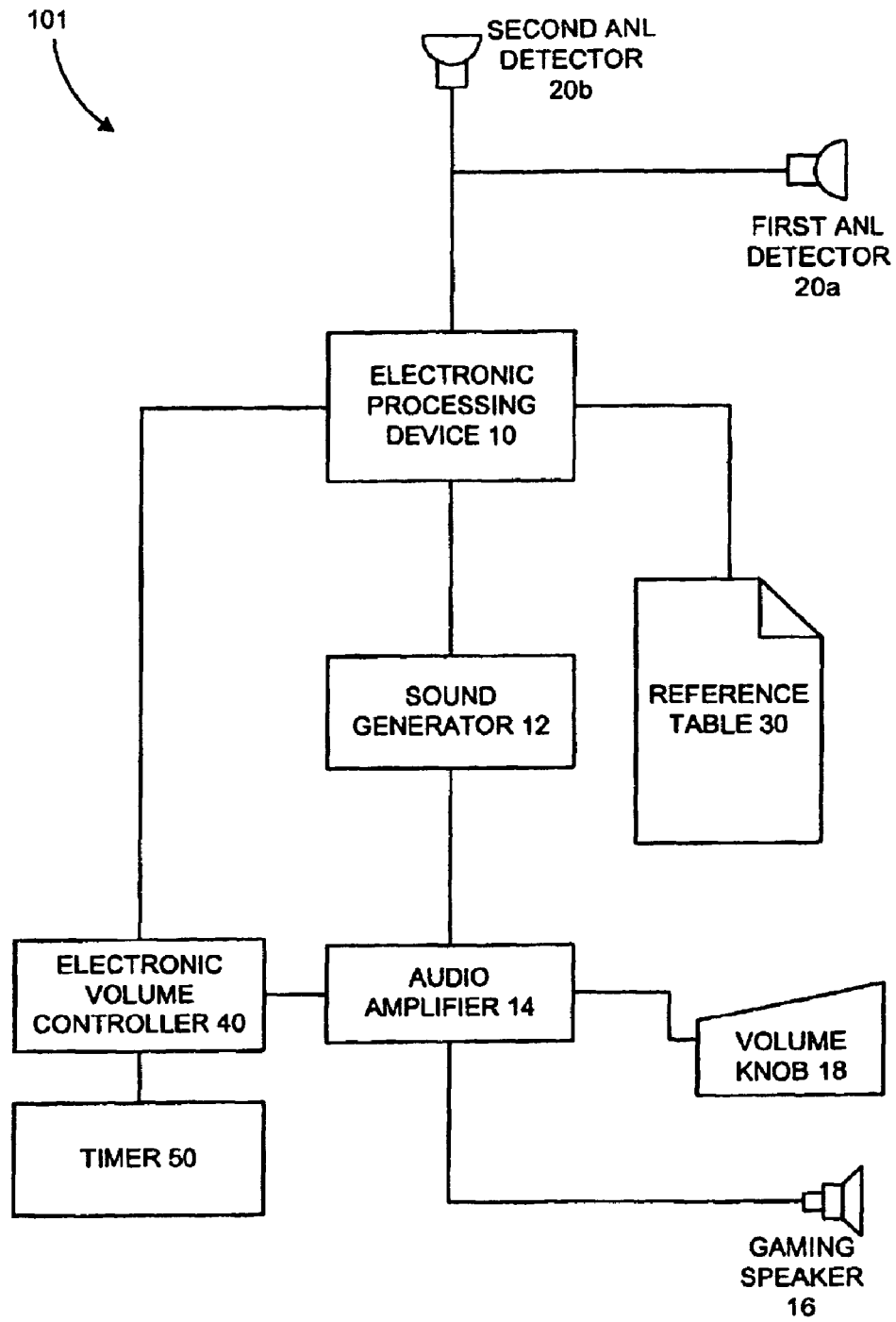
FIG. 3 is a diagram of a second embodiment of the gaming machine having a plurality of ambient noise level detector devices.
Figure 4:
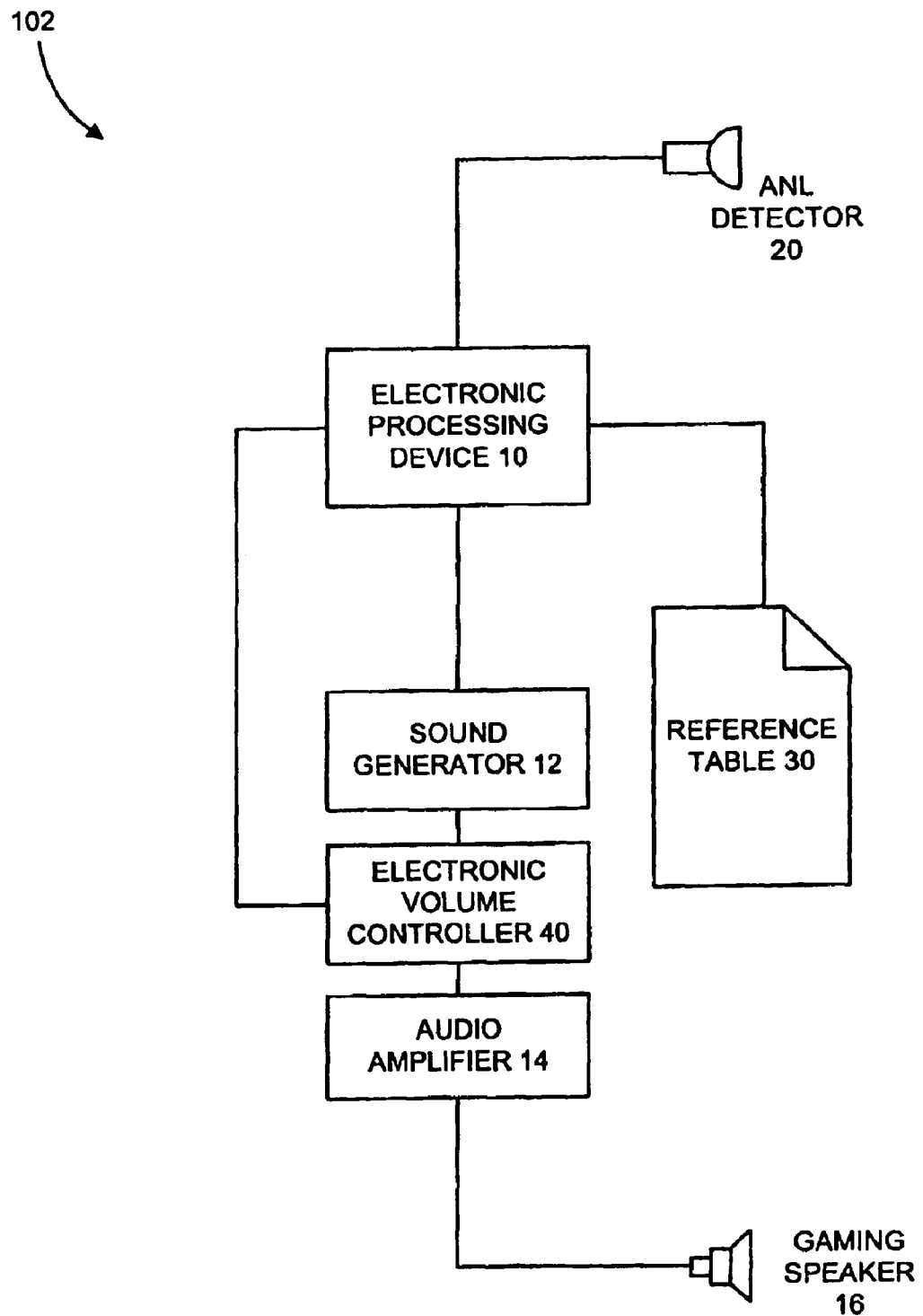
FIG. 4 is a diagram of a third embodiment of the gaming machine.

Ambient noise level detector 20 can include one or more of such sound level measuring devices. As an example, gaming machine 100' (FIG. 3) has a first detector device 20a used to measure, e.g., a local ambient noise level adjacent a user of the gaming machine. A second detector device 20b can measure, in this example, a more global casino-area ambient noise level in the environment of gaming machine 100'.

Returning to FIG. 2, gaming machine 100 further includes electronic volume controller 40 configured to regulate the volume of the gaming sound output in relation to a detected ambient noise level. The present system can adjust the entirety of a given gaming sound output or a portion thereof. In a first example, a relatively high ambient noise level is detected, i.e., the noise level typical of a casino during peak hours. Electronic volume controller 40 can adjust the volume of gaming sound outputs 17 to compensate for the higher background noise level of the casino.

Electronic volume controller 40 can adjust a gaming sound output 17 at a number of stages. In an embodiment having audio amplifier 14 that ordinarily amplifies the gaming sound pre-amp signal 13 to produce a gaming sound amplified signal 15 (see FIG. 5), electronic volume controller 40 can cause audio amplifier 14 to produce adjusted gaming sound amplified signal 15', having an amplification level adjusted in relation to the ambient noise level. Volume control can be accomplished through circuitry configured to accept a volume input for a signal 13 and reduce or attenuate the voltage thereof.

Gaming sound pre-amp signal 13 can be an electronic signal, such as a .WAV file, having a volume control register, i.e. a component of the pre-amp signal 13 that specifies a sound loudness. In one embodiment, the volume control register of gaming sound pre-amp signal 13 can be adjusted by electronic volume controller 40.

Figure 6:
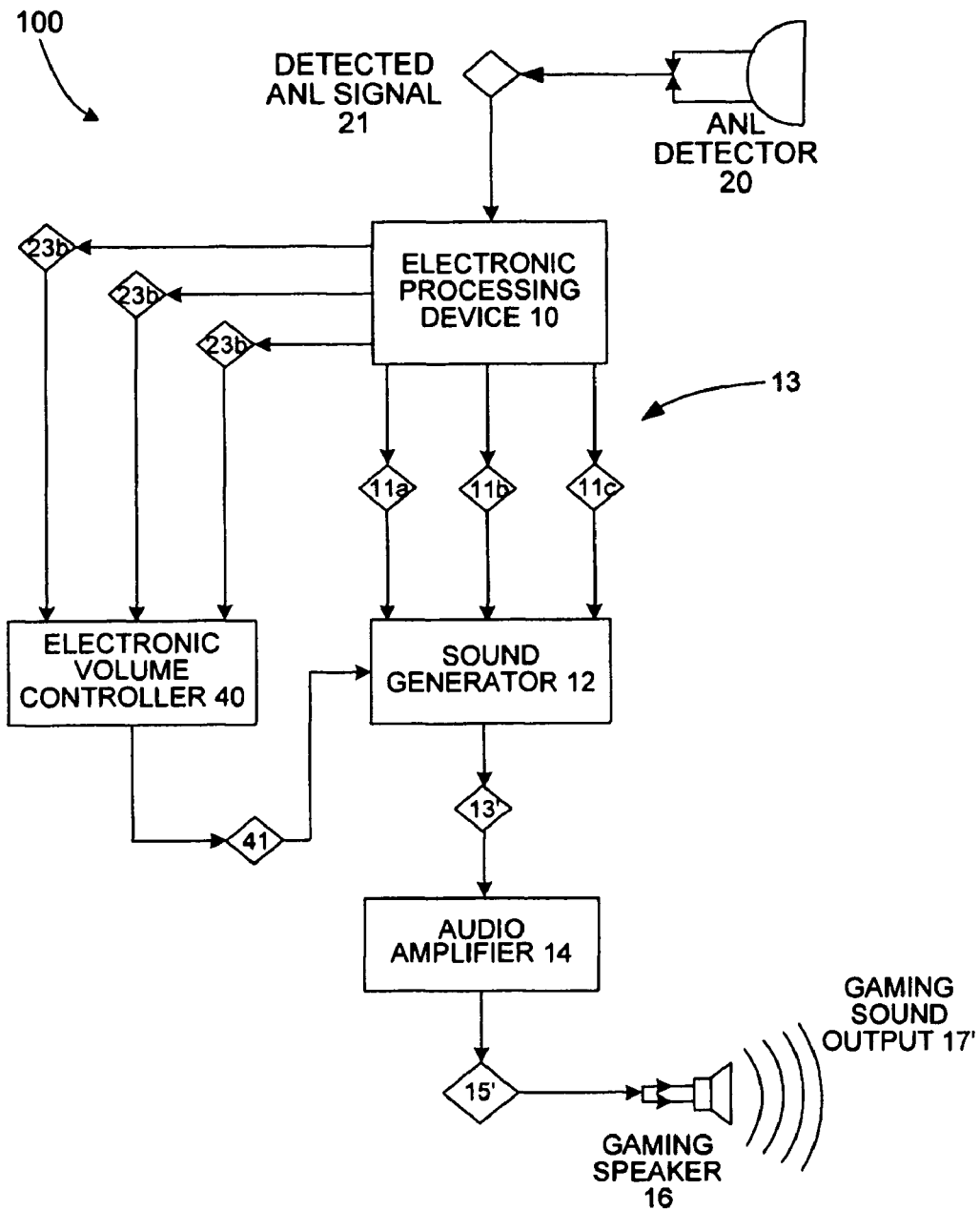
FIG. 6 is a diagram of a fourth embodiment of the gaming machine.

Alternatively, electronic volume controller 40 can adjust gaming sound pre-amp signal 13. One such implementation is illustrated in FIG. 6. Gaming sound pre-amp signal 13 can be an electronic signal comprising a plurality of signals 11a-11c corresponding to individual sounds. Electronic processing device 10 issues gaming sound regulation commands 23a-23c in relation to detected ambient noise signal 21. In response to the regulation signals 23-a-23c, electronic volume controller 40 produces gaming sound regulation signal 41, causing sound generator 12 to issue adjusted gaming sound pre-amp signal 13'.

Figure 7:
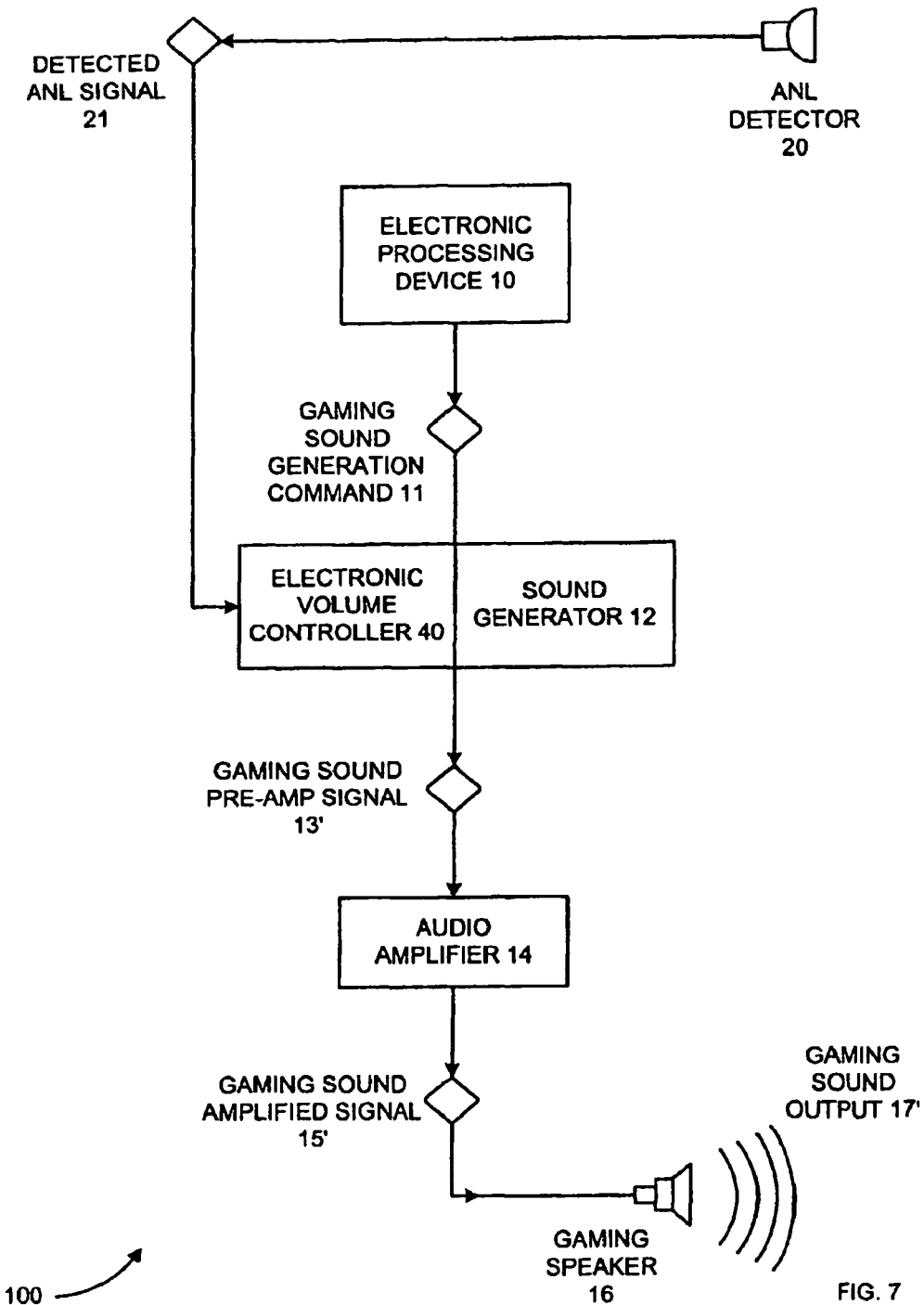
FIG. 7 is a diagram of the embodiment of FIG. 4, showing the flow of signals.

It can be appreciated that, functioning in this capacity, electronic volume controller 40 also can serve as sound generator 12. One such implementation is illustrated in FIG. 7. Here, combination electric volume controller 40/sound generator 12 generates a gaming sound pre-amp signal 13' for transmission to audio amplifier 14. Gaming sound pre-amp signal 13' is amplified by audio amplifier 14 to produce gaming sound amplified signal 15', resulting in gaming sound output 17'.

In some implementations of the invention, after an ambient noise level is detected for the vicinity of gaming machine 100, the detected ambient noise level can be compared to values in a reference table 30 of ambient noise level:adjustment values. (See reference table 30 of FIGS. 2, 3, 4 and 5.) The volume of the gaming sound pre-amp signal 13 or gaming sound amplified signal 15 is then adjusted in accordance with a value in the reference table to yield an appropriately adjusted gaming sound output. Those of skill in the art will realize that other data structures comparable to a reference table could be used for this purpose.

Alternatively, electronic volume controller 40 can attenuate the voltage of pre-amp signal 13. A voltage corresponding to a maximum loudness is selected as a default voltage for pre-amp signal 13. Electronic volume controller 40 thereby can attenuate the gaming sound output 17 by downwardly adjustment through electronic attenuation of signal 13's voltage.

Sound-producing casino gaming machines generally are structured to produce a plurality of gaming sounds. Gaming sounds can be classified into two or more classes or categories according to the intended audience. One category of sounds is intended primarily for a person who is currently using the gaming machine that produces the sounds. For instance, it sometimes is desired to communicate a game instruction (instruction sound) to a player. These signals can include musical tones, synthesized or recorded speech, etc.

Modern casino gaming machines, such as a slot machine, are electronic devices. Using a slot machine as an example, the symbol-bearing spinning reels of traditional machines are currently presented by electronic displays. A modern gaming machine therefore typically issues a spinning reel sound (game-play sound), mimicking the sound traditionally produced by older mechanical reels. Such game-play sounds are primarily for the benefit of those currently playing a game on a particular gaming machine. As such, these sounds also fall within the first category of sounds.

Gaming machine 100 also can produce attraction sounds, that is, sounds, music, and other noises to attract a player to that machine or to an adjacent gaming machine. Attraction sounds are not primarily intended for a person who is currently playing the machine that produces the attraction sounds. Accordingly, attraction sounds may be considered a second category of sounds.

Sounds issued to celebrate a winning event by a player (which may be referred to herein as celebratory sounds or winning sounds) typically are desired to be easily heard by the player, and are also preferred to be heard by others in the casino. Celebratory sounds may be produced, for example, in connection with game-winning events, bonusing events, jackpot events, or the like. It will be appreciated that such events may involve winning an underlying wagering game, but may also happen randomly or be associated with "interim wins," etc. Accordingly, celebratory sounds may or may not be associated with winning an underlying game. Celebratory sounds increase player pleasure, alert others of the player's success, and stimulate others to play a casino gaming machine.

It can be appreciated that sounds, or classes of sounds, can have varying volume regulation profiles. Instruction sounds and game-play sounds are relevant only to the player and need not be heard elsewhere in the casino. Attraction sounds generally are intended only for those persons near gaming machine 100. On the other hand, it is generally preferred that winning sounds be heard by the greatest number of people and not limited to those near gaming machine 100.

Further, it is undesirable to indiscriminately amplify instruction sounds, attraction sounds and game-play sounds and thereby potentially increase the overall ambient noise of the casino.

In one embodiment, electronic volume controller 40 can be configured to differentially regulate the volumes of the plurality of gaming machine sound outputs in relation to a detected ambient noise level. Differential regulation can be by classification of the gaming sound (e.g., winning sound versus instruction sound) or identity of a particular sound (e.g., a large jackpot winning sound can be upwardly-adjusted more than a small jackpot winning sound).

As has been seen, attraction sounds can be employed whether gaming machine 100 is active or inactive. Casino gaming machine 100 as described herein can further include timer 50 (see FIG. 2) operative to measure a game inactive time period. Attraction sounds can be increased in volume after gaming machine 100 has been unplayed for a specified period of time.

Similarly, gaming machine 100 can be structured to adjust gaming sound output volumes when a person is detected at the gaming machine. For example, gaming machine 100 can increase attraction sound volumes to attract a person near but not at the gaming machine. The volume level of such sounds may be suitable for player attraction but overloud for a player at the machine. Upon detecting a player at the machine (e.g., when a player sits at gaming machine 100 or enters a coin, or when a person comes within the vicinity of gaming machine), the gaming machine then can reduce the sound output volume to a level more appropriate for the player.

A manual volume adjustment control 18 can be provided, by which a player or casino personnel can increase or decrease the overall audio volume of the machine. Electronic volume controller 40 can be activated to override a manual volume setting upon the occurrence of a specified event, e.g., gaming machine 100 being inactive for a specific time period or detection by ambient noise level detector 20 of a significant change in the detected ambient noise level.

Conventional gaming machines can be widely varied, for example having a plurality of speakers 16 for stereophonic sound, a multi-channel audio amplifier and/or one or more single-channel audio amplifiers. It is understood that the present system can be employed with these various sound component configurations.

Some implementations of the invention involve categorizing the various types of sounds that can be produced by a gaming machine and directing the sounds according to the category, e.g., according to the intended audience. It will be appreciated by those of skill in the art that such sounds are generally produced in response to instructions or commands directed to a particular audio device. Accordingly, the terms "sound" and "sound command" (or the like) may sometimes be used synonymously herein.

Figure 8:
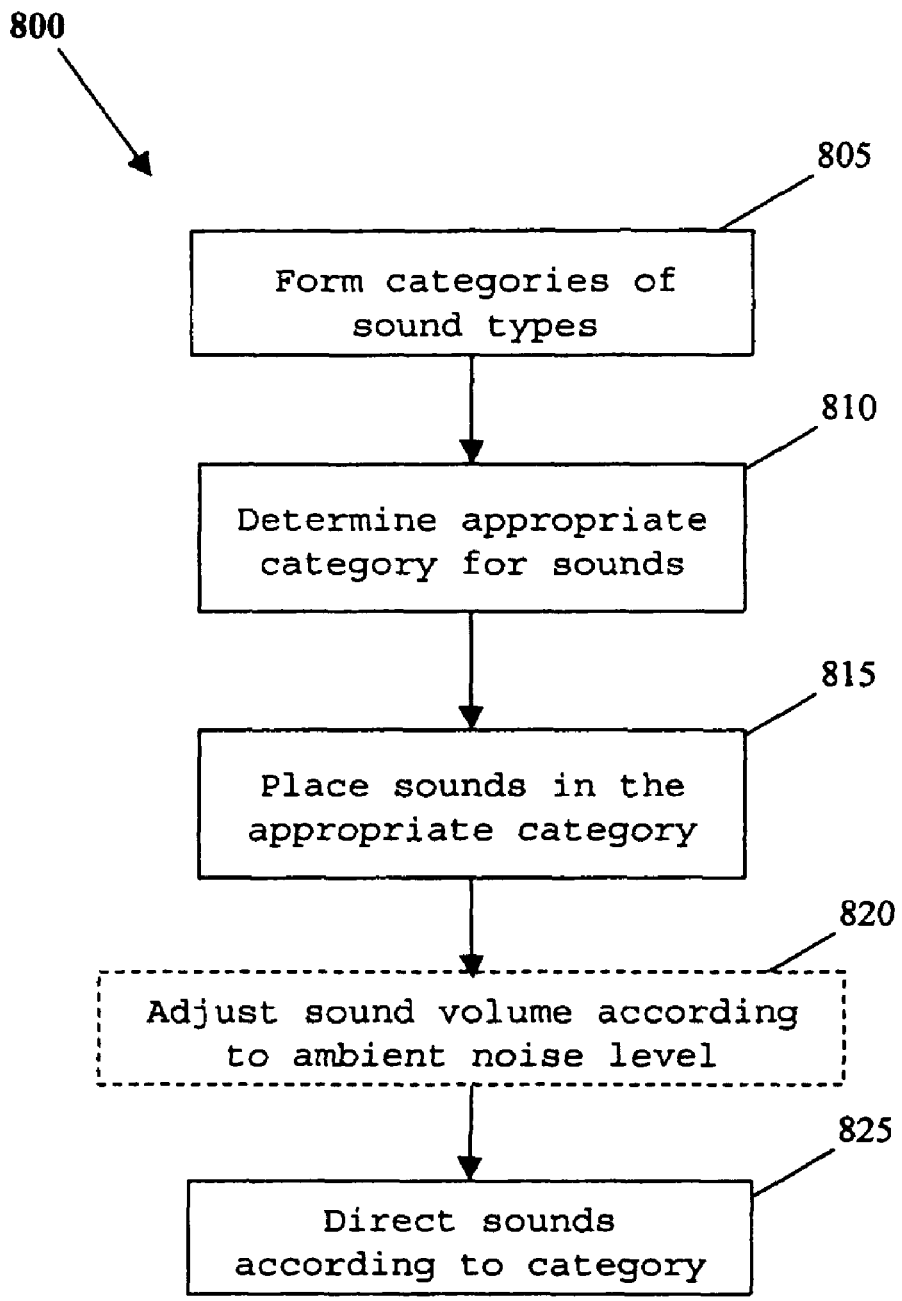
FIG. 8 is a flow chart that outlines a method of the invention.

FIG. 8 is a flow chart that provides an overview of some such implementations. Method 800, as with other methods of the present invention, is not necessarily performed in the order shown and may include more or fewer steps than are shown and described herein.

In step 805, categories of sound types are formed. According to some methods of the invention, the previously-described categories are formed: (1) sounds intended primarily for a person playing the gaming machine that is producing the sounds; (2) sounds intended primarily to be heard by other people; and (3) sounds that are intended to be heard not only by the person playing that gaming machine, but also by other people.

However, the present invention includes methods for categorizing sounds in alternative ways that may involve more or fewer than 3 categories. For example, some such methods involve categorizing sounds into 2 categories: (1) sounds produced during game play and (2) "attraction" sounds produced when a game is not being played. Although not as desirable in some respects as the previously-described 3-category approach, such methods may be simpler to implement and may require little or no modification of legacy software, as described in more detail below.

In step 810, the appropriate category is determined for the sounds that may be produced by a gaming machine. In step 815, the sounds are placed in the appropriate category. Optionally, the sound volume may be adjusted according to ambient noise level (step 820). The sounds are then directed according to the category. (Step 825.) These steps may be performed in a variety of ways, according to the desired implementation.

Figure 14A:
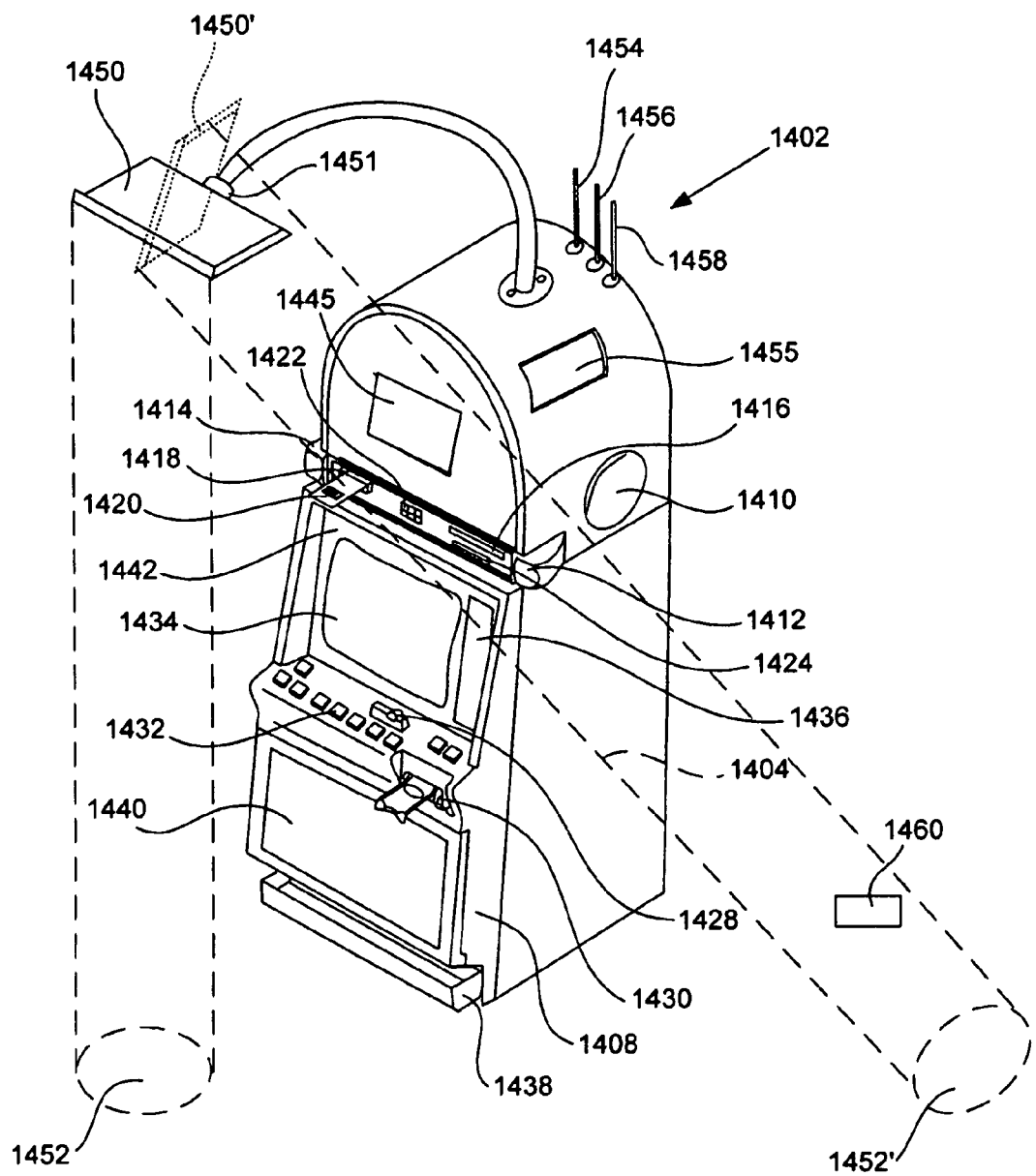
FIG. 14A illustrates a gaming machine having a movable directional audio device and an RFID reader.
Figure 14B:
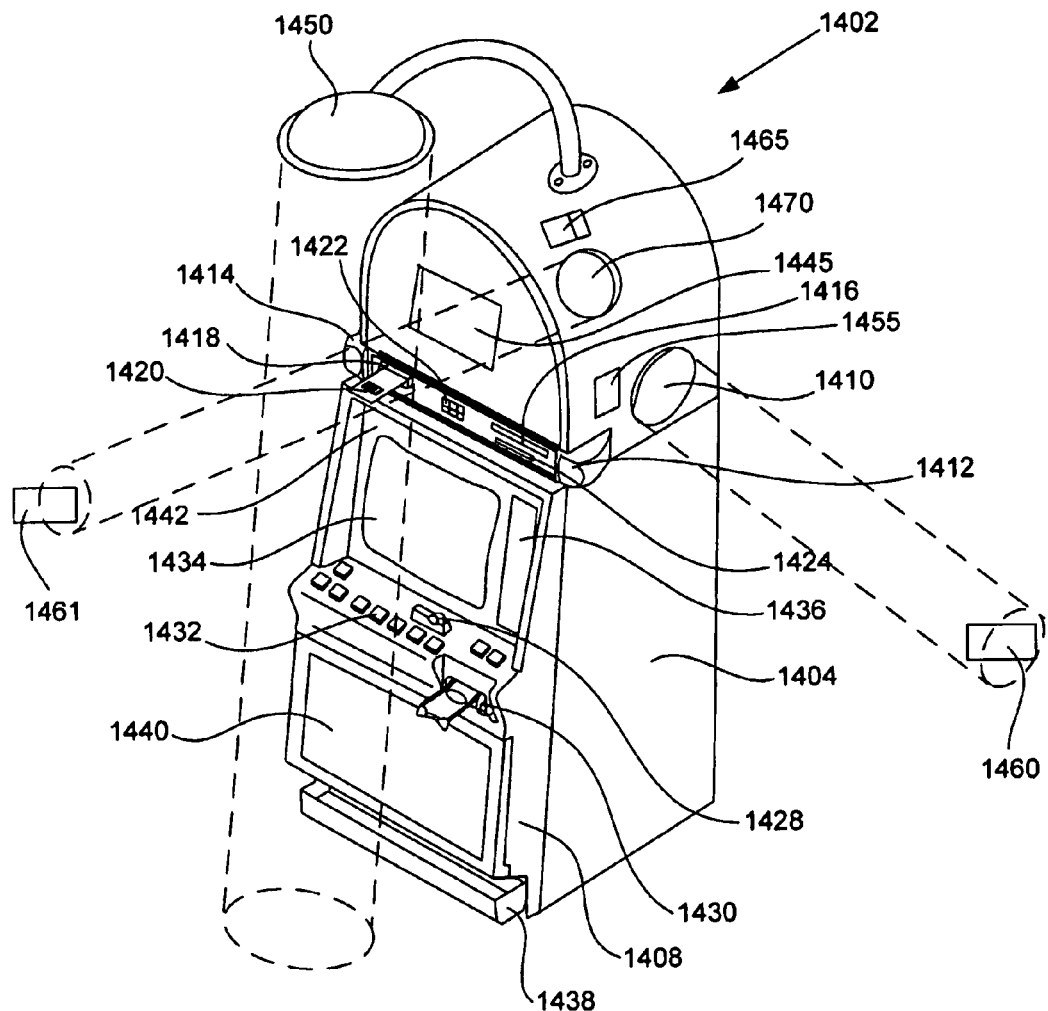
FIG. 14B illustrates a gaming machine having a plurality of directional audio devices and RFID readers.

For example, in some implementations of the invention, the directing step 825 involves reproducing predetermined sounds via a directional audio device such as a sound dome, a speaker array, a device for producing ultrasonic waves (e.g., in a beam) that produce audible sounds via interaction with a medium, or another such device for producing directional sound. For example, sounds that are intended to be heard primarily by a player of a gaming machine may be reproduced by a directional audio device that is configured to direct sound to an area in which a player is expected to be while using the gaming machine. Some exemplary gaming machines with directional audio devices are illustrated in FIGS. 14A and 14B, and are described below.

Some directional audio devices concentrate acoustic energy into a narrow beam so that it can be projected to a discrete area, much as a spotlight focuses light. Sound waves emitted by a directional audio device behave in a manner somewhat resembling the coherent light waves emitted by a laser. When a sound beam is aimed at a listener, that person senses the sound as if it is coming from a headset or from inside the listener's head. The sound beam may also be directed at a target (such as a wall) that reflects the sound beam toward an intended listener. When the listener steps out of the beam, or when the beam is aimed in a different direction, the sound may disappear almost completely, unless the listener hears the sound reflected from another object.

There are at least two developers working on competing versions of directional sound systems. Elwood Norris has created directed audio devices that he markets under the name "HyperSonic Sound™," produced by American Technology Corporation (ATC). ATC's HyperSonic Sound™ device produces a column of parallel acoustic wavefronts using a special amplifier and loudspeaker. F. Joseph Pompei has developed a directed audio system that he terms an "audio spotlight," which is commercially available under the Holosonic™ brand.

Such directional audio devices may be associated with (e.g., mounted on) a gaming machine. Accordingly, in some implementations of the invention, such gaming machines may execute game software that has been created for execution by gaming machines having directed audio capability.

However, the present invention is not so limited. For example, the present invention may be implemented in a gaming machine that does not have a directional audio device. In some such implementations, certain categories of sounds may be reproduced by predetermined conventional speakers of a gaming machine. For example, most (or all) game play sounds may be reproduced by speakers that are near the controls and/or display of the gaming machine, whereas attraction sounds may be reproduced by speakers that are on the side(s) back, etc., of the gaming machine.

Figure 9:
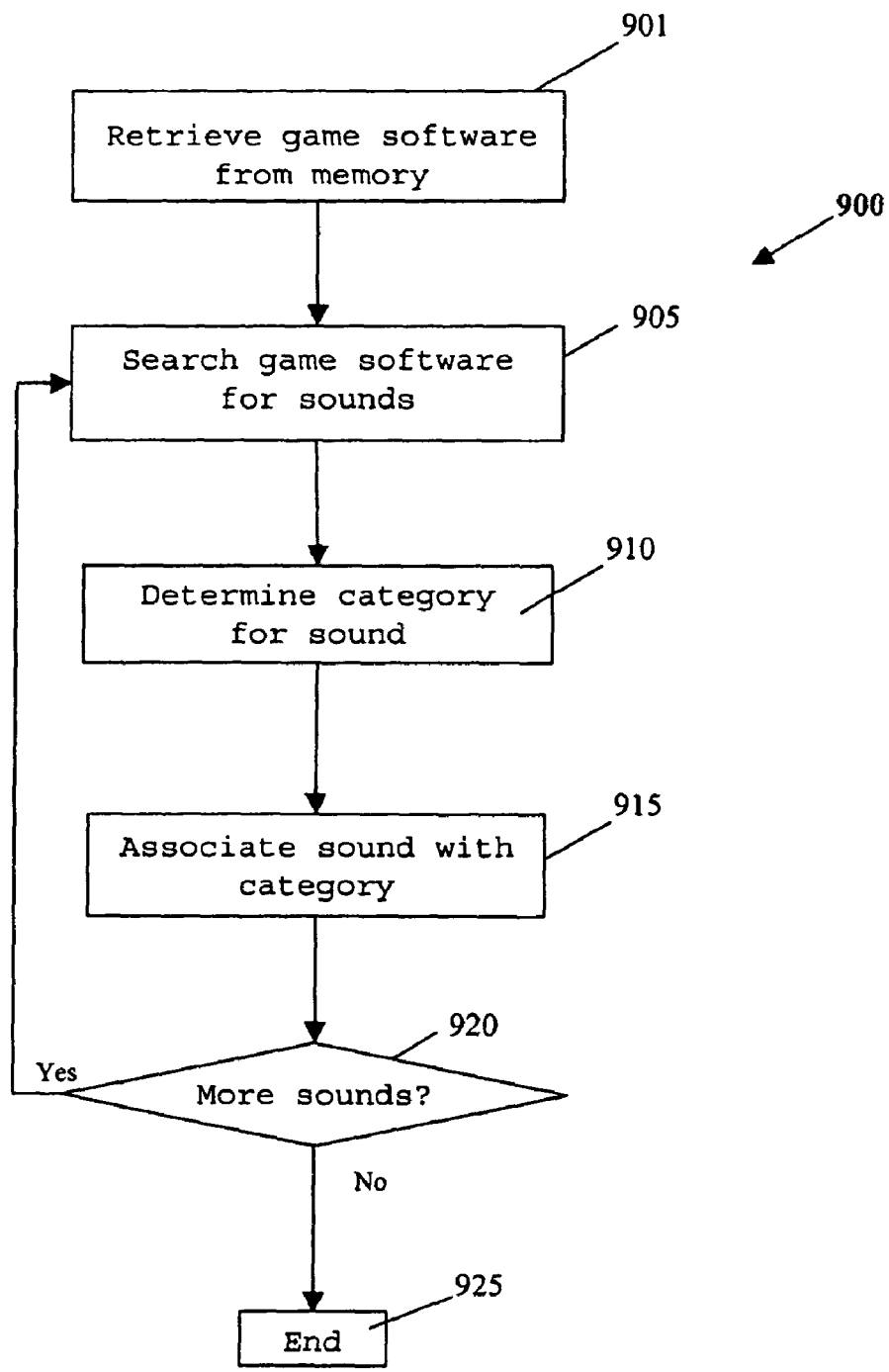
FIG. 9 is a flow chart that outlines another method of the invention.

The present invention encompasses game software that involves directing commands to predetermined audio devices of a gaming machine according to the corresponding sound categories. However, according to some implementations of the invention, sounds that may be produced according to the instructions of legacy software are categorized and "flagged" for subsequent use. One such implementation is outlined by the flow chart of FIG. 9. The steps of method 900 are preferably performed, for example, by a host device, by a server or by another device before the gaming software is provided to gaming machines. However, in alternative implementations, the steps of method 900 may be performed by a gaming machine, e.g., after the legacy software has been loaded into a local memory.

In step 901, the legacy game software (preferably the source code of the game software) is retrieved from memory. In step 905, the legacy game software is searched for commands that would cause sounds to be produced. In step 910, categories are determined for the sounds to be produced and in step 915, the sounds are associated with the categories. Preferably, the categories and associations are consistent with the capabilities of the type of gaming machine on which the game software will be executed. For example, the sounds may be flagged according to each category in a manner that indicates what sound-producing device(s) (potentially including but not limited to speaker(s), directional audio device(s) and/or target(s)) will be used to reproduce the sound. According to some implementations of the invention, some sounds may be flagged for reproduction by a directional audio device that is associated with a gaming machine and/or other audio system components deployed in or near a gaming machine. For example, some implementations provide networked audio (and other) components that correspond to gaming events and/or related events, but that are not necessarily physically attached to the gaming machine. U.S. patent application Ser. No. 11/517,861, entitled "Casino Display Methods and Devices" describes relevant features and is hereby incorporated by reference.

A variety of methods may be used to categorize such sounds, including but not limited to the recognition of key words. Such key words may be associated with instructions to a player to insert indicia of credit, instructions to take an action pertaining to the game, an indication that a player has won a jackpot, etc. In addition, sound categories may be determined by context. For example, all sounds that are produced when a game is not being played could be categorized as attraction sounds. Similarly, all sounds that are produced after a game starts but before an outcome has been determined could be categorized as being intended to be heard by a player of the gaming machine. Such sounds may be flagged for reproduction by a directional audio device that directs sound to an area near the controls of the gaming machine, so that the sounds will be heard only by a player of the gaming machine.

In some implementations, a default category is used for sounds for which a category is unclear. For example, if no definite determination can be made for a sound's categorization, the sound command may be flagged for reproduction by one or more predetermined sound-producing devices associated with the gaming machine and/or other audio system components deployed in or near a gaming machine. For example, the default category could indicate that the sounds will be reproduced by all speakers of the gaming machine, reproduced only by a particular speaker (e.g., by a directional audio device), etc. In alternative implementations, a request may be sent to an operator for a determination of how a particular sound should be categorized.

In step 920, it is determined whether more sounds need to be categorized. If so, the process returns to step 905. If not, the process ends (step 925.) If legacy software that has been written for a gaming machine having a platform and/or peripherals that are different from those of the gaming machine on which the software will be executed, some form(s) of emulation may be required. For example, if legacy software is executed on a gaming machine that has a directional audio device, some form of hardware abstraction, memory address mapping, etc., may be required in order successfully to process commands that are directed only to conventional speakers. Relevant devices and methods are described in U.S. patent application Ser. No. 11/205,619, entitled "EMULATION METHODS AND DEVICES FOR A GAMING MACHINE," filed Aug. 15, 2005 and in U.S. patent application Ser. No. 11/225,406, entitled "EMULATION IN A SECURE REGULATED ENVIRONMENT," filed Sep. 12, 2005, both of which are hereby incorporated by reference.

Figure 10A:
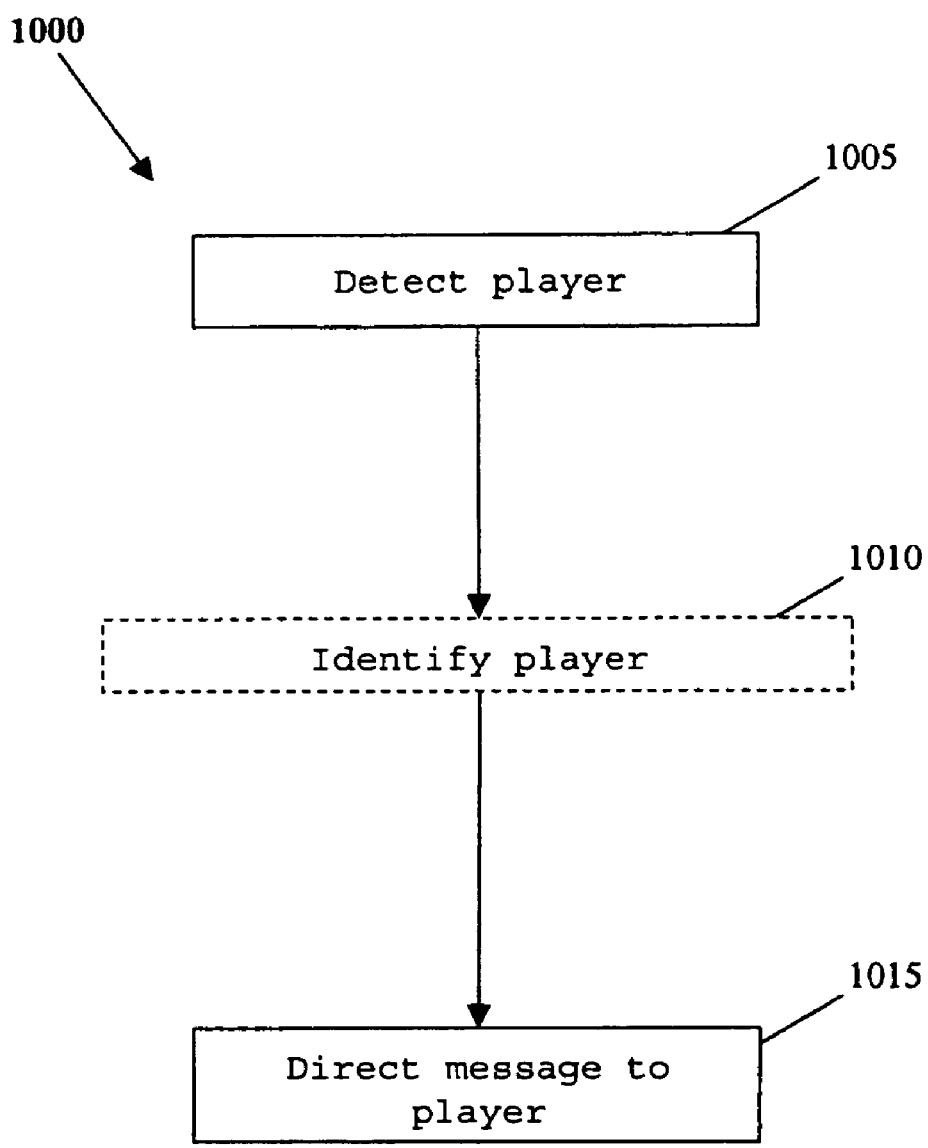
FIG. 10A is a flow chart that outlines another method of the invention.

Some implementations of the invention involve detecting and identifying potential players of a gaming machine. The broad contours of some such implementations are outlined in the flow chart of FIG. 10A. The process of method 1000 may be enabled, for example, when it is determined that no game is currently being played on the gaming machine, after a player cashes out, or upon the presence or absence of other predetermined criteria.

In step 1005, a player is detected. According to some such implementations, step 1005 involves the use of one or more devices such as motion detectors and/or radio frequency identification ("RFID") devices (such as RFID readers) that are deployed on or near a gaming machine. Some such methods and devices will be described in more detail below with reference to FIGS. 10B and 11. A player's presence may also be inferred by the occurrence of other events, such as the placing of a wager, the insertion of a player tracking card, etc. After a person has been detected, a message may be directed to that person, e.g., inviting that person to play one or more wagering games on the gaming machine. (Step 1015.)

Method 100 may or may not involve identification of the person (step 1010). Accordingly, detecting a player does not necessarily involve identifying the player. For example, the message of step 1015 may be initiated because motion is detected in the proximity of the gaming machine. Even if an RFID tag is read that appears to be associated with a person (and not, for example, with a commercial product), it may not be possible to identify that person. The person may, for example, belong to a player loyalty program that is not associated with, and the databases for which are not accessible by, the gaming machine. Some players may prefer to remain anonymous, but could still be detected according to some aspects of the invention. However, in some implementations of the invention, a personalized message may be made to the person if the person can be identified.

Depending on the implementation, step 1015 may or may not involve directing the message by using a directional audio device. For example, the message may be reproduced by a speaker that is closest to an RFID tag that has been read by the RFID reader. Alternatively, the personalized message may simply be reproduced by one or more speakers of the gaming machine but not preferentially reproduced by a speaker near the person's presumed location. If a directional audio device is used to convey a personalized message, however, information may be directed to the player without being heard by others. Accordingly, in some implementations of the invention a directional audio device may be used to convey confidential information to a player.

Figure 10B:
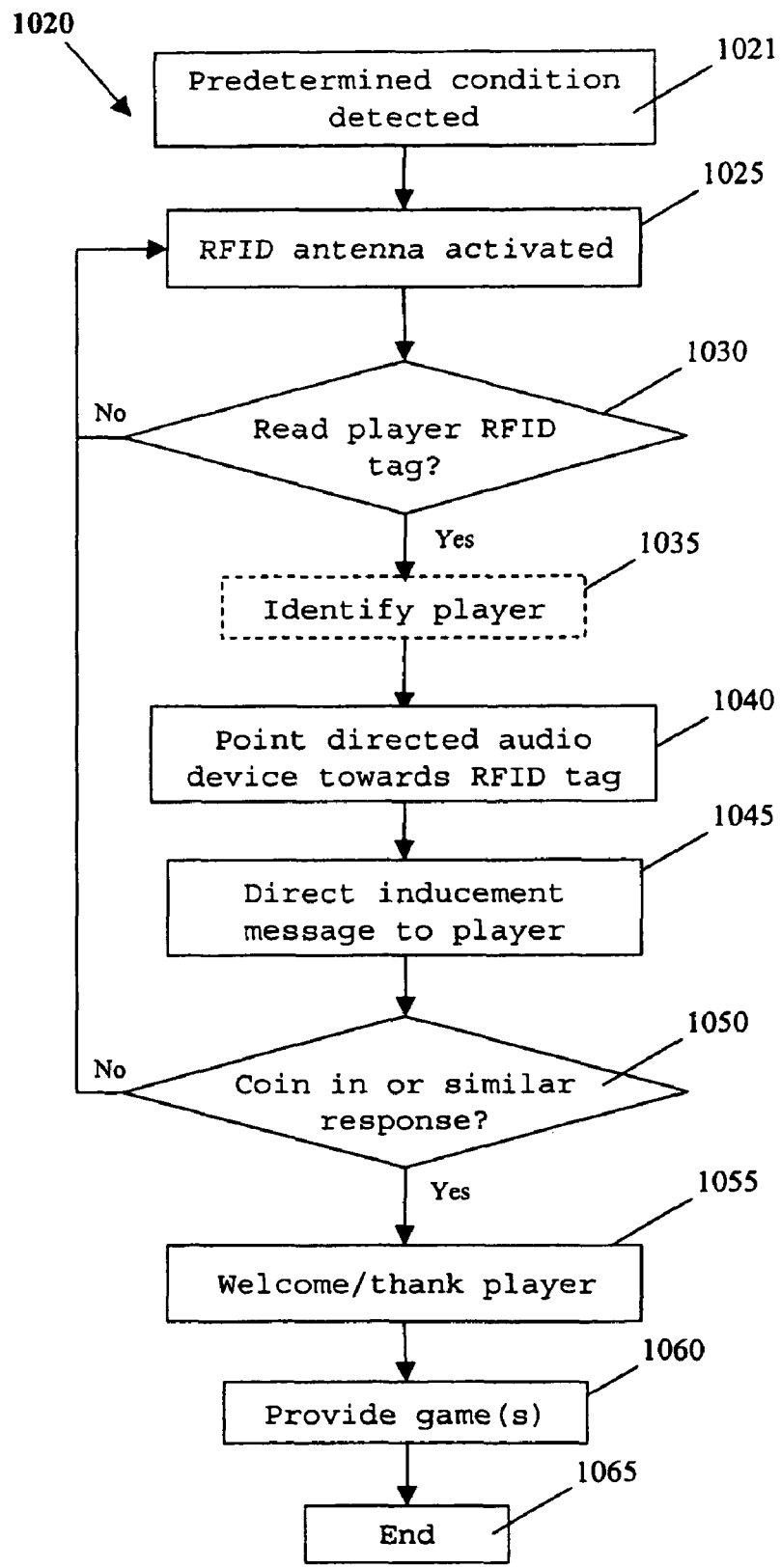
FIG. 10B is a flow chart that outlines another method of the invention.

FIG. 10B is a flow chart that illustrates method 1020, which is one example of the more generalized method 1000. In this example, method 1020 is triggered when one or more predetermined conditions are detected. The conditions may, for example, indicate that a player is not currently playing a gaming machine. When the predetermined conditions are met, one or more RFID readers will be enabled to detect RFID tags of nearby players. The RFID tags may be, for example, part of a player tracking card, dongle, bracelet or other such device.

When an RFID tag is read (step 1030), it is preferably determined whether the RFID tag is associated with a human being or with, e.g., a commercial product. This information should be ascertainable by reference to one or more fields of the RFID tag, as noted elsewhere herein. The determination may be made by a logic device of the RFID reader (e.g., by CPU 1110 of RFID reader 1100 [see FIG. 11]), by a logic device of the gaming machine, or by another networked logic device.

In this implementation of the invention, if an RFID tag is read that is a player RFID tag, a directional audio device will direct a sound beam to the approximate location of the player's RFID tag. In some such implementations, the directional audio device may re-position itself, as shown in FIG. 14A and described below. For example, the directional audio device may direct a sound beam directly toward the RFID tag, slightly above the RFID tag, slightly in front of the tag's last know location, etc. In alternative implementations, the directional audio device will already be positioned to direct a sound beam toward the approximate location of the player's RFID tag, e.g., as shown in FIG. 14B and described below.

According to some aspects of method 1020, if an RFID tag is associated with a person, an attempt is made to identify the person (e.g., by reference to a player tracking database or another such database). (Step 1035.) As noted above, if a person can be identified, the inducement message of step 1045 can be a personalized inducement message.

If the person responds favorably to the inducement message, the player may input some indicium of credit in order to initiate play of a wagering game. In step 1050, it is determined whether the person has taken such an action. If so, the player is welcomed, thanked and/or greeted (step 1055) and a game is provided (step 1060). If the player inserts a player tracking card (or otherwise provides player tracking identification data), the player may be personally greeted.

Figure 11:
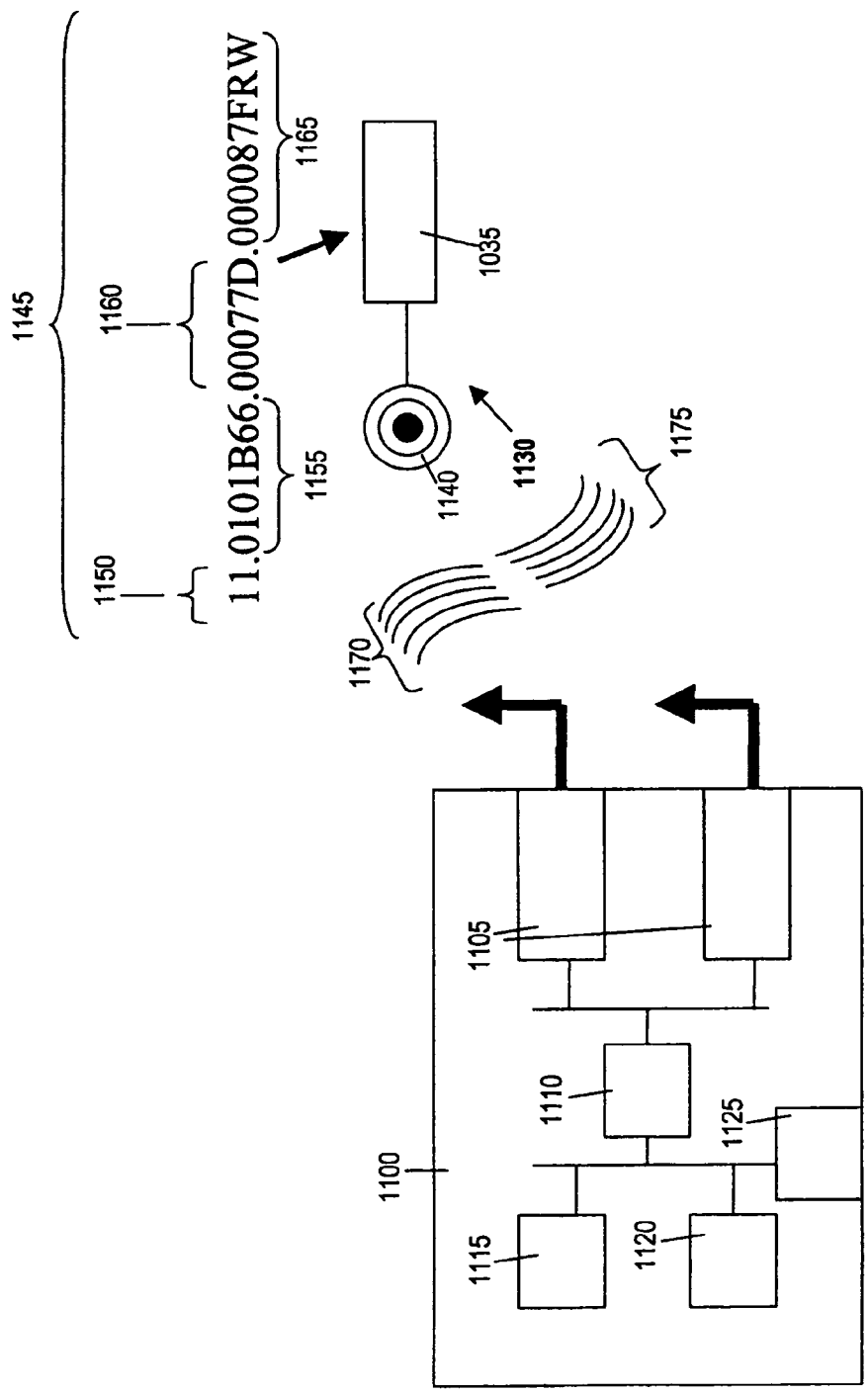
FIG. 11 illustrates an RFID reader and an RFID tag.

FIG. 11 illustrates an RFID reader that can be configured to perform, at least in part, some methods of the present invention. In some implementations of the invention, RFID reader 1100 may be associated with an individual gaming machine, gaming station, terminal, virtual terminal, console, etc. In some such implementations, RFID reader 1100 is configured for communication with a gaming machine and with at least a portion of a gaming network, e.g., with a player tracking system. In alternative implementations of the invention, RFID reader 1100 may be associated with more than one gaming machine, e.g., with one or more banks of gaming machines.

RFID reader 1100 includes one or more RF radios 1105 for transmitting RF waves to, and receiving modulated RF waves from, RFID tags. RF radios 1105 provide raw RF data that is converted by an analog-to-digital converter (not shown) and conveyed to other elements of RFID reader 1100. In some embodiments, these data are stored, at least temporarily, by CPU 1110 in memory 1115 before being transmitted to other parts of a gaming network via network interface 1125. Interface 1125 may be any convenient type of interface that is appropriate for the particular embodiment, such as a USB interface, an Ethernet interface, etc.

Flash memory 1120 is used to store a program (a "bootloader") for booting/initializing RFID reader 1100. The bootloader, which is usually stored in a separate, partitioned area of flash memory 1120, also allows RFID reader 1100 to recover from a power loss, etc. New versions of the image file (e.g., the running, base image necessary to operate the RFID device) may be copied into flash memory 1120.

Newer RFID devices also include dry contact input/output leads to connect to other devices or to certain types of networks. These newer RFID devices have evolved with regard to the amount of memory, flash, CPU capacity and methods of determination of the number, type and content of RFID tags in their field of view.

Here, RFID tag 1130 includes microprocessor 1135 and antenna 1140. In this example, RFID tag 1130 is powered by a magnetic field 1170 generated by an RFID reader 125. Antenna 1140 picks up the magnetic signal 1170. RFID tag 1130 modulates the signal 1170 according to information coded in the tag and transmits the modulated signal 1175 to the RFID reader 1100.

RFID tags use the Electronic Product Code ("EPC" or "ePC") format for encoding information. An EPC code typically includes a substantial number of bits (common formats are 64, 96 and 128 bits), which allows for identification of individual people, products, locations and other information. In some implementations, an RFID tag may allow direct identification of a person. However, in part because of privacy concerns, some implementations of the invention involve player RFID tags that require reference to a look-up table or a similar database in order to identify an individual person. Such a database may be maintained in accordance with a player tracking program or a similar gaming-related program.

In this example, EPC 1145 is formatted for product information and includes header 1150, EPC Manager field 1155, Object class field 1160 and serial number field 1165. EPC Manager field 1155 contains manufacturer information. Object class field 1160 includes a product's stock-keeping unit ("SKU") number. Serial number field 1165 is a field that can uniquely identify the specific instance of an individual product i.e., not just a make or model, but also down to a specific "serial number" of a make and model.

Accordingly, it is important for at least one logic device in the gaming network of the invention to be able to differentiate between EPC codes that correspond to people (e.g., to a player tracking account) and EPC codes that correspond to products, etc. For example, if RFID reader 1100 reads a tag (such as EPC 1145) that does not correspond to a player, it should be determined in step 1030 of method 1020 that a player's RFID tag has not been read. The determination may be made by a logic device of a gaming machine, of an RFID reader, of a server or a host device on a gaming network, etc.

Figure 12:
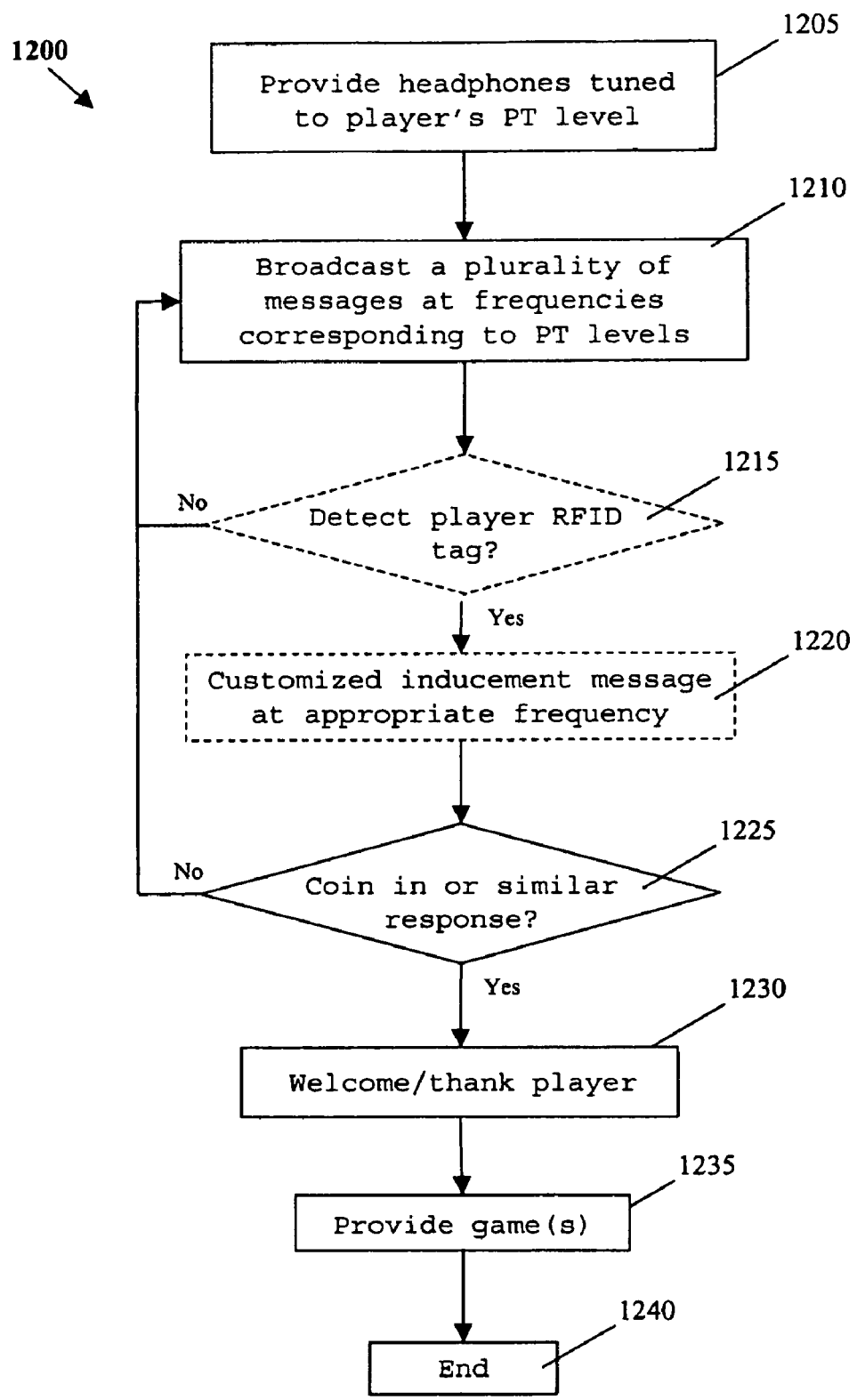
FIG. 12 is a flow chart that outlines another method of the invention.
Figure 13B:
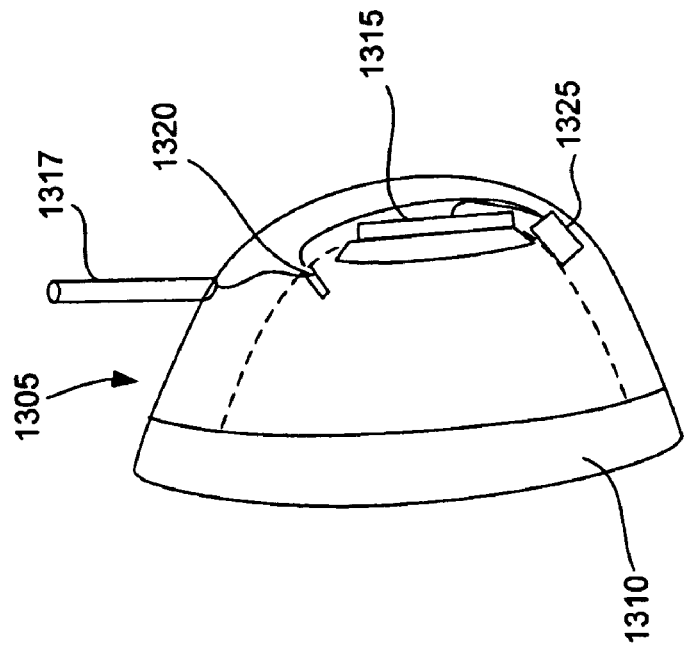
FIG. 13B is a cutaway view of a headphone cup that may be used to implement some aspects of the invention.
Figure 13A:
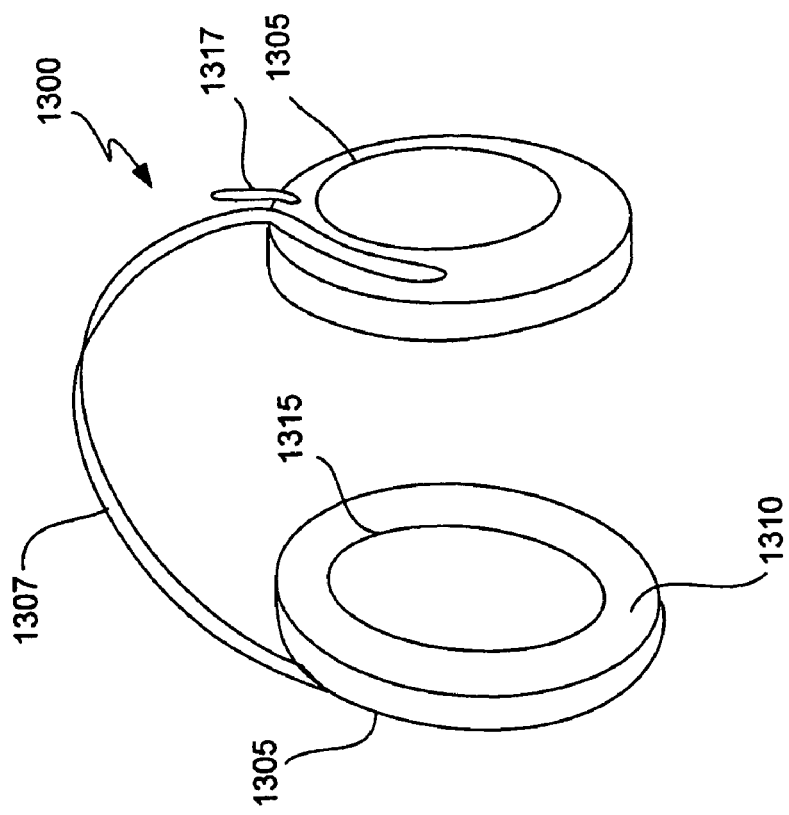
FIG. 13A illustrates headphones that may be used to implement some aspects of the invention.

The flow chart of FIG. 12 outlines the steps of an alternative method 1200 for directing attraction sounds and/or personalized messages to potential players. According to method 1200, headphones (or the like) are provided that are tuned to a player's player tracking level. (Step 1205.) Some exemplary headphones are illustrated in FIGS. 13A and 13B, described below. Attraction sounds are broadcast (e.g., by radio transmitters 1454, 1456 and 1458 of FIG. 14A) at frequencies corresponding to those for which the headphones are tuned. (Step 1210.) For example, if a player tracking program has an entry level, an intermediate level and an elite level, attraction sounds could be simultaneously broadcast by a gaming machine (or a device associated with a gaming machine) at 3 different frequencies, each of which is used for a corresponding player tracking level. The headphones provided in step 1205 are tuned to the player tracking level of the player to which the headphones are assigned.

Optionally, the player may also be personally identified even before the player chooses to play at a particular gaming machine. For example, an RFID reader associated with the gaming machine may be configured for detecting player RFID tags (step 1215). (The RFID reader may also be configured for communication with the device that is broadcasting the attraction sounds.) If a player can be identified, a customized inducement message may be directed to the player at the appropriate frequency. (Step 1220.)

In some implementations of the invention, a player's headphones convey identification information to a gaming machine. For example, when a player's headphones communicate with the gaming machine (via a wired or wireless connection), the player may be identified according to a information stored in a memory of the headphones. In some implementations, this information is provided in connection with a player tracking/player loyalty program. For example, specialized headphones according to the invention may be offered to players who reach a certain level of a player tracking/loyalty program. An interface of the headphones (such as a USB interface, an Ethernet interface, an infrared interface, etc.) may be used to communicate player identification and/or player tracking information. Relevant information, including but not limited to information regarding the use of a loyalty point device (such as a USB dongle) to identify a player, is provided in U.S. patent application Ser. No. 10/871,876 entitled "PERSONAL GAMING DEVICE AND METHOD OF PRESENTING A GAME" and filed on Jun. 17, 2004, which is hereby incorporated by reference.

Whether or not the player has previously been identified, if the player inputs sufficient indicia of credit, the player will be thanked and/or welcomed (step 1230) and a wagering game will be provided. (Step 1235.) As with method 1020, if the player inserts a player tracking card (or otherwise provides player tracking identification data), the player may also be personally greeted even if the player was not previously identified.

FIGS. 13A and 13B illustrate some exemplary headphones that may be used in accordance with the present invention. Headphones 1300 include two earcups 1305 connected by band 1307. Each earcup 1305 includes resilient material 1310, which may be a foam such as urethane or other such resilient material known in the art. Resilient material 1310 allows earcups 1305 to be positioned firmly against a user's ears, thereby providing at least some degree of passive noise cancellation without causing discomfort. In this example, headphones 1300 include antenna 1317 for receiving radio transmissions.

Referring to the cutaway diagram of FIG. 13B, a simplified version of the inner workings of one earcup 1305 is shown. In this example, the earcup 1305 includes tuner 1320 that has been set to a frequency corresponding to a predetermined player tracking level. Amplifier 1325 is configured to drive speaker 1315 to reproduce radio transmissions that are received by antenna 1317 on the frequency to which tuner 1320 has been tuned.

In addition to providing passive noise cancellation, some embodiments of the invention use modified versions of active noise cancellation methods and devices known in the art. For example, Bose® QuietComfort® 2 headphones could be modified to include an appropriate antenna and tuner for implementing method 1200 and the like. In such devices, microphones in the earcups actively monitor what the listener hears, including unwanted outside sound. The difference between the unwanted sound and the desired sound is then electronically processed, creating a correction signal that acts to negate the unwanted noise. The speaker within each earcup is then fed the correction signal. This signal, combined with the passive noise reduction of the headset itself, can dramatically reduce unwanted noise.

In some implementations of the invention, noise-cancellation techniques are implemented, at least in part, by a directional sound device. A microphone disposed on or near a player's head is used to monitor sounds near the player, including unwanted outside sound. The desired game-related sounds (i.e., sounds relating to that player's gaming) are known. The difference between the unwanted sound and the desired game-related sounds is then electronically determined, creating a correction signal that acts to negate the unwanted sound. The directional audio device is then fed the correction signal, which is sent in a noise-canceling beam toward the last known location of the player's head. This location may be determined, for example, by reference to a location of the microphone, e.g., by reading an RFID tag attached to the microphone. Preferably, the location of the player's head is determined frequently, so that the noise-canceling beam can accurately be transmitted to the player's head.

Gaming Machines

Figure 14C:
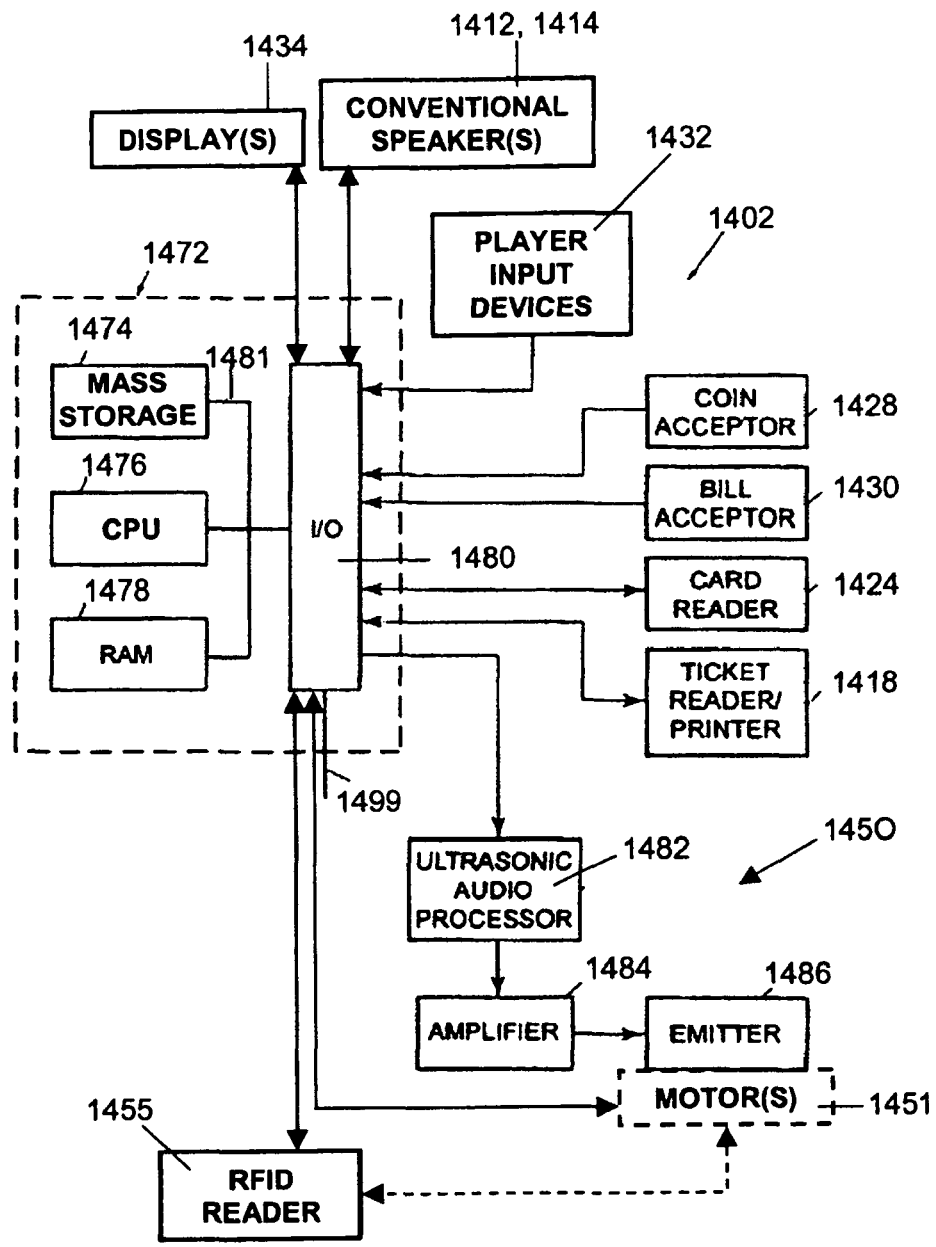
FIG. 14C is a block diagram that illustrates an exemplary manner of interconnecting the devices shown in FIGS. 14A and 14B.

Turning next to FIG. 14A, a video gaming machine 1402 of the present invention is shown. Machine 1402 includes a main cabinet 1404, which generally surrounds the machine interior (not shown) and is viewable by users. The main cabinet includes a main door 1408 on the front of the machine, which opens to provide access to the interior of the machine. Attached to the main door are player-input switches or buttons 1432, a coin acceptor 1428, and a bill validator 1430, a coin tray 1438, and a belly glass 1440. Viewable through the main door is a video display monitor 34 and an information panel 1436. The display monitor 1434 will typically be a cathode ray tube, high resolution flat-panel LCD, or other conventional electronically controlled video monitor. The information panel 1436 may be a back-lit, silk screened glass panel with lettering to indicate general game information including, for example, a game denomination (e.g. $0.25 or $1). The bill validator 1430, player-input switches 1432, video display monitor 1434, and information panel are devices used to play a game on the game machine 1402. These and other devices are controlled by circuitry (e.g. the master gaming controller) housed inside the main cabinet 1404 of the machine 2 (e.g., as schematically depicted in FIG. 14C).

Many different types of games, including mechanical slot games, video slot games, video poker, video black jack, video pachinko and lottery, may be provided with gaming machines of this invention. In particular, the gaming machine 1402 may be operable to provide a play of many different instances of games of chance. The instances may be differentiated according to themes, sounds, graphics, type of game (e.g., slot game vs. card game), denomination, number of paylines, maximum jackpot, progressive or non-progressive, bonus games, etc. The gaming machine 1402 may be operable to allow a player to select a game of chance to play from a plurality of instances available on the gaming machine. For example, the gaming machine may provide a menu with a list of the instances of games that are available for play on the gaming machine and a player may be able to select from the list a first instance of a game of chance that they wish to play.

The various instances of games available for play on the gaming machine 1402 may be stored as game software on a mass storage device in the gaming machine or may be generated on a remote gaming device but then displayed on the gaming machine. The gaming machine 1402 may execute game software, such as but not limited to video streaming software that allows the game to be displayed on the gaming machine. Referring to FIG. 14C, when an instance of the game software is stored on the gaming machine 1402, it may be loaded from the mass storage device 1474 into a RAM 1478 for execution. In some cases, after a selection of an instance, the game software that allows the selected instance to be generated may be downloaded from a remote gaming device, such as a server or another gaming machine. Alternatively, one or more instances of game software may have been previously downloaded to the gaming machine.

Referring once again to FIG. 14A, the gaming machine 1402 includes a top box 1406, which sits on top of the main cabinet 1404. The top box 1406 houses a number of devices that may be used to add features to a game being played on the gaming machine 1402, including speakers 1410, 1412, 1414 and 1450, a ticket reader/printer 1418 which prints and/or reads bar-coded tickets 1420, a key pad 1422 for entering information such as player tracking information, a florescent display 1416 for displaying player tracking information, a card reader 1424 for entering a magnetic striped card containing player tracking information, and a video display screen 1442. The ticket reader/printer 1418 may be used to print tickets for a cashless ticketing system. As noted above, this embodiment of gaming machine 1402 includes radio transmitter 1454 for transmitting inducement sounds on selected frequencies corresponding to levels of a player tracking program.

As noted elsewhere herein, some gaming machines may include one or more RFID readers 1455. Some gaming machines may use an RFID reader instead of, or in addition to, a magnetic card reader for reading a player's identification and/or player tracking information. According to some implementations of the invention (e.g., as described above with reference to FIG. 10B), one or more RFID readers 1455 may be configured for reading RFID tags of players in the vicinity of the gaming machine 1402 but who are not yet using the gaming machine 1402.

In the embodiments illustrated FIGS. 14A and 14B, at least one RFID reader 1455 is used for this purpose. In the embodiment depicted in FIG. 14A, one RFID reader 1455 is mounted on opposing sides of top box 1406. (Only one of these RFID readers 1455 is visible in FIG. 14A.) In alternative implementations, more or fewer RFID readers 1455 may be deployed.

When predetermined conditions are met (e.g., when no game is currently being played on gaming machine 1402), the RFID reader(s) will be enabled to detect RFID tags 1460 of nearby players. The RFID tags may be, for example, part of a player tracking card, dongle, bracelet or other such device.

In this embodiment, directional speaker 1450 may be controlled by motor 1451 to direct a sound beam to more than one location. The type of directional speaker 1450 shown in FIG. 14B is similar to the HyperSonic Sound™ device provided by American Technology Corporation. During game play, directional speaker 1450 directs a sound beam along a trajectory 1452 that includes a location in which the player's head is expected to be positioned when a player is operating the gaming machine. In this example, the "game play" sounds are directed vertically downward, but other orientations may be used. In some implantations, a player may be able to control an input device of the gaming machine in order to direct game play sounds to a desired position.

However, in this embodiment of gaming machine 1402, motor 1451 can re-orient directional speaker 1450 to direct attraction sounds to an area 1452' at or near where RFID reader 1455 is reading a player's RFID tag. As noted elsewhere, the attraction sounds could include personalized messages if a player has been identified, e.g., by reference to a database that the gaming machine may access via a network.

FIG. 14B illustrates a gaming machine having a plurality of directional audio devices and RFID readers. In this example, the directional audio devices are similar to those provided by Holosonic® and are in fixed positions. Directional audio device 1450 is dedicated to providing game play (or other) sounds to a player of the gaming machine 1402. However, directional audio device 1410 is positioned to direct a sound beam to a location near RFID tag 1460, which has been detected by RFID reader 1455. Similarly, directional audio device 1470 is positioned to direct a sound beam to a location near RFID tag 1461, which has been detected by RFID reader 1465. In this example, the antenna(s) of RFID readers 1455 and 1465 are configured to read RFID tags in only a relatively small zone.

Further, the top box 1406 may house different or additional devices than shown in FIGS. 14A and 14B. For example, the top box may contain a bonus wheel or a back-lit silk screened panel which may be used to add bonus features to the game being played on the gaming machine. As another example, the top box may contain a display for a progressive jackpot offered on the gaming machine. During a game, these devices are controlled and powered, in part, by circuitry (e.g. a master gaming controller) housed within the main cabinet 4 of the machine 2.

FIG. 14C is a block diagram of a number of components that may be incorporated in a gaming machine of the present invention. In this example, controller 1472 includes mass storage device 1474, microprocessor ("CPU") 1476, random-access memory (RAM) 14786 and input/output (I/O) circuitry 1480, all of which may be interconnected via an address/data bus 1481. It should be appreciated that although only one microprocessor 1476 is shown, controller 1472 may include multiple microprocessors 1476. Similarly, the memory of the controller 100 may include multiple RAMs 1478 and mass storage devices 1474. Although I/O circuit 1480 is shown as a single block, it should be appreciated that I/O circuit 1480 may include a number of components. RAM(s) 1478 and mass storage device(s) 1474 may be implemented as semiconductor memories, magnetically readable memories, and/or optically readable memories, for example.

FIG. 14C illustrates that display(s) 1434, conventional speakers (e.g., speakers 1412 and 1414), player input devices 1432, coin acceptor 1428, bill acceptor 1430, card reader 1424 and the ticket reader/printer 1418 may be operatively coupled to the I/O 1480, each of those components being so coupled by either a unidirectional or bidirectional, single-line or multiple-line data link, which may depend on the design of the component that is used. In this example, gaming machine 1402 has separate player tracking system circuitry for reading magnetic player tracking cards. This player tracking circuitry is configured for communication with I/O 1480 (e.g., via interface 1499).

In this example, gaming machine 1402 includes a single directional audio device 1450 that includes an emitter 1486 operatively coupled to a sound circuit comprising ultrasonic audio processor 1482 and amplifier 1484. In this example, ultrasonic audio processor 1482 is coupled to I/O 1480. Ultrasonic processor 1482 is configured to receive an audio signal from controller 1472 and to converts the audio signal into an ultrasonic signal, which is then amplified by amplifier 1484 and emitted by emitter 1486. As described above with reference to FIG. 14A, at least one motor 1451 may optionally be provided for positioning directional audio device 1450.

This embodiment of gaming machine 1402 also includes an RFID reader 1455 coupled to I/O 1480. RFID reader 1455 is optionally coupled directly to motor(s) 1451.

It will be appreciated by those of skill in the art that different configurations could be used than the one illustrated in FIG. 14C. For example, one or more of the illustrated components may be connected to I/O 1480 via a common bus or other data link that is shared by a number of components. Furthermore, one or more of the components may be directly connected to microprocessor 1476 without passing through I/O 1480.

Understand that gaming machine 1402 is but one example from a wide range of gaming machine designs on which the present invention may be implemented. For example, not all suitable gaming machines have top boxes or player tracking features. Further, some gaming machines have only a single game display—mechanical or video, while others are designed for bar tables and have displays that face upwards. As another example, a game may be generated in on a host computer and may be displayed on a remote terminal or a remote gaming device. The remote gaming device may be connected to the host computer via a network of some type such as a local area network, a wide area network, an intranet or the Internet. The remote gaming device may be a portable gaming device such as but not limited to a cell phone, a personal digital assistant, and a wireless game player. Images rendered from 3-D gaming environments may be displayed on portable gaming devices that are used to play a game of chance. Further a gaming machine or server may include gaming logic for commanding a remote gaming device to render an image from a virtual camera in a 3-D gaming environments stored on the remote gaming device and to display the rendered image on a display located on the remote gaming device. Thus, those of skill in the art will understand that the present invention, as described below, can be deployed on most any gaming machine now available or hereafter developed.

Some preferred gaming machines of the present assignee are implemented with special features and/or additional circuitry that differentiates them from general-purpose computers (e.g., desktop PC's and laptops). Gaming machines are highly regulated to ensure fairness and, in many cases, gaming machines are operable to dispense monetary awards of multiple millions of dollars. Therefore, to satisfy security and regulatory requirements in a gaming environment, hardware and software architectures may be implemented in gaming machines that differ significantly from those of general-purpose computers. A description of gaming machines relative to general-purpose computing machines and some examples of the additional (or different) components and features found in gaming machines are described below.

At first glance, one might think that adapting PC technologies to the gaming industry would be a simple proposition because both PCs and gaming machines employ microprocessors that control a variety of devices. However, because of such reasons as 1) the regulatory requirements that are placed upon gaming machines, 2) the harsh environment in which gaming machines operate, 3) security requirements and 4) fault tolerance requirements, adapting PC technologies to a gaming machine can be quite difficult. Further, techniques and methods for solving a problem in the PC industry, such as device compatibility and connectivity issues, might not be adequate in the gaming environment. For instance, a fault or a weakness tolerated in a PC, such as security holes in software or frequent crashes, may not be tolerated in a gaming machine because in a gaming machine these faults can lead to a direct loss of funds from the gaming machine, such as stolen cash or loss of revenue when the gaming machine is not operating properly.

For the purposes of illustration, a few differences between PC systems and gaming systems will be described. A first difference between gaming machines and common PC based computers systems is that gaming machines are designed to be state-based systems. In a state-based system, the system stores and maintains its current state in a non-volatile memory, such that, in the event of a power failure or other malfunction the gaming machine will return to its current state when the power is restored. For instance, if a player was shown an award for a game of chance and, before the award could be provided to the player the power failed, the gaming machine, upon the restoration of power, would return to the state where the award is indicated. As anyone who has used a PC knows, PCs are not state machines and a majority of data is usually lost when a malfunction occurs. This requirement affects the software and hardware design on a gaming machine.

A second important difference between gaming machines and common PC based computer systems is that for regulation purposes, the software on the gaming machine used to generate the game of chance and operate the gaming machine has been designed to be static and monolithic to prevent cheating by the operator of gaming machine. For instance, one solution that has been employed in the gaming industry to prevent cheating and satisfy regulatory requirements has been to manufacture a gaming machine that can use a proprietary processor running instructions to generate the game of chance from an EPROM or other form of non-volatile memory. The coding instructions on the EPROM are static (non-changeable) and must be approved by a gaming regulators in a particular jurisdiction and installed in the presence of a person representing the gaming jurisdiction. Any changes to any part of the software required to generate the game of chance, such as adding a new device driver used by the master gaming controller to operate a device during generation of the game of chance can require a new EPROM to be burnt, approved by the gaming jurisdiction and reinstalled on the gaming machine in the presence of a gaming regulator. Regardless of whether the EPROM solution is used, to gain approval in most gaming jurisdictions, a gaming machine must demonstrate sufficient safeguards that prevent an operator or player of a gaming machine from manipulating hardware and software in a manner that gives them an unfair and some cases an illegal advantage. The gaming machine should have a means to determine if the code it will execute is valid. If the code is not valid, the gaming machine must have a means to prevent the code from being executed. The code validation requirements in the gaming industry affect both hardware and software designs on gaming machines.

A third important difference between gaming machines and common PC based computer systems is the number and kinds of peripheral devices used on a gaming machine are not as great as on PC based computer systems. Traditionally, in the gaming industry, gaming machines have been relatively simple in the sense that the number of peripheral devices and the number of functions the gaming machine has been limited. Further, in operation, the functionality of gaming machines were relatively constant once the gaming machine was deployed, i.e., new peripherals devices and new gaming software were infrequently added to the gaming machine. This differs from a PC where users will go out and buy different combinations of devices and software from different manufacturers and connect them to a PC to suit their needs depending on a desired application. Therefore, the types of devices connected to a PC may vary greatly from user to user depending in their individual requirements and may vary significantly over time.

Although the variety of devices available for a PC may be greater than on a gaming machine, gaming machines still have unique device requirements that differ from a PC, such as device security requirements not usually addressed by PCs. For instance, monetary devices, such as coin dispensers, bill validators and ticket printers and computing devices that are used to govern the input and output of cash to a gaming machine have security requirements that are not typically addressed in PCs. Therefore, many PC techniques and methods developed to facilitate device connectivity and device compatibility do not address the emphasis placed on security in the gaming industry.

To address some of the issues described above, a number of hardware/software components and architectures are utilized in gaming machines that are not typically found in general purpose computing devices, such as PCs. These hardware/software components and architectures, as described below in more detail, include but are not limited to watchdog timers, voltage monitoring systems, state-based software architecture and supporting hardware, specialized communication interfaces, security monitoring and trusted memory.

A watchdog timer is normally used in IGT gaming machines to provide a software failure detection mechanism. In a normally operating system, the operating software periodically accesses control registers in the watchdog timer subsystem to "re-trigger" the watchdog. Should the operating software fail to access the control registers within a preset timeframe, the watchdog timer will timeout and generate a system reset. Typical watchdog timer circuits contain a loadable timeout counter register to allow the operating software to set the timeout interval within a certain range of time. A differentiating feature of the some preferred circuits is that the operating software cannot completely disable the function of the watchdog timer. In other words, the watchdog timer always functions from the time power is applied to the board.

IGT gaming computer platforms preferably use several power supply voltages to operate portions of the computer circuitry. These can be generated in a central power supply or locally on the computer board. If any of these voltages falls out of the tolerance limits of the circuitry they power, unpredictable operation of the computer may result. Though most modern general-purpose computers include voltage monitoring circuitry, these types of circuits only report voltage status to the operating software. Out of tolerance voltages can cause software malfunction, creating a potential uncontrolled condition in the gaming computer. Gaming machines of the present assignee typically have power supplies with tighter voltage margins than that required by the operating circuitry. In addition, the voltage monitoring circuitry implemented in IGT gaming computers typically has two thresholds of control. The first threshold generates a software event that can be detected by the operating software and an error condition generated. This threshold is triggered when a power supply voltage falls out of the tolerance range of the power supply, but is still within the operating range of the circuitry. The second threshold is set when a power supply voltage falls out of the operating tolerance of the circuitry. In this case, the circuitry generates a reset, halting operation of the computer.

The standard method of operation for IGT slot machine game software is to use a state machine. Different functions of the game (bet, play, result, points in the graphical presentation, etc.) may be defined as a state. When a game moves from one state to another, critical data regarding the game software is stored in a custom non-volatile memory subsystem. This is critical to ensure the player's wager and credits are preserved and to minimize potential disputes in the event of a malfunction on the gaming machine.

In general, the gaming machine does not advance from a first state to a second state until critical information that allows the first state to be reconstructed is stored. This feature allows the game to recover operation to the current state of play in the event of a malfunction, loss of power, etc that occurred just prior to the malfunction. After the state of the gaming machine is restored during the play of a game of chance, game play may resume and the game may be completed in a manner that is no different than if the malfunction had not occurred. Typically, battery backed RAM devices are used to preserve this critical data although other types of non-volatile memory devices may be employed. These memory devices are not used in typical general-purpose computers.

As described in the preceding paragraph, when a malfunction occurs during a game of chance, the gaming machine may be restored to a state in the game of chance just prior to when the malfunction occurred. The restored state may include metering information and graphical information that was displayed on the gaming machine in the state prior to the malfunction. For example, when the malfunction occurs during the play of a card game after the cards have been dealt, the gaming machine may be restored with the cards that were previously displayed as part of the card game. As another example, a bonus game may be triggered during the play of a game of chance where a player is required to make a number of selections on a video display screen. When a malfunction has occurred after the player has made one or more selections, the gaming machine may be restored to a state that shows the graphical presentation at the just prior to the malfunction including an indication of selections that have already been made by the player. In general, the gaming machine may be restored to any state in a plurality of states that occur in the game of chance that occurs while the game of chance is played or to states that occur between the play of a game of chance.

Game history information regarding previous games played such as an amount wagered, the outcome of the game and so forth may also be stored in a non-volatile memory device. The information stored in the non-volatile memory may be detailed enough to reconstruct a portion of the graphical presentation that was previously presented on the gaming machine and the state of the gaming machine (e.g., credits) at the time the game of chance was played. The game history information may be utilized in the event of a dispute. For example, a player may decide that in a previous game of chance that they did not receive credit for an award that they believed they won. The game history information may be used to reconstruct the state of the gaming machine prior, during and/or after the disputed game to demonstrate whether the player was correct or not in their assertion.

Another feature of gaming machines, such as IGT gaming computers, is that they often contain unique interfaces, including serial interfaces, to connect to specific subsystems internal and external to the slot machine. The serial devices may have electrical interface requirements that differ from the "standard" EIA 232 serial interfaces provided by general-purpose computers. These interfaces may include EIA 485, EIA 422, Fiber Optic Serial, optically coupled serial interfaces, current loop style serial interfaces, etc. In addition, to conserve serial interfaces internally in the slot machine, serial devices may be connected in a shared, daisy-chain fashion where multiple peripheral devices are connected to a single serial channel.

The serial interfaces may be used to transmit information using communication protocols that are unique to the gaming industry. For example, IGT's Netplex is a proprietary communication protocol used for serial communication between gaming devices. As another example, SAS is a communication protocol used to transmit information, such as metering information, from a gaming machine to a remote device. Often SAS is used in conjunction with a player tracking system.

IGT gaming machines may alternatively be treated as peripheral devices to a casino communication controller and connected in a shared daisy chain fashion to a single serial interface. In both cases, the peripheral devices are preferably assigned device addresses. If so, the serial controller circuitry must implement a method to generate or detect unique device addresses. General-purpose computer serial ports are not able to do this.

Security monitoring circuits detect intrusion into an IGT gaming machine by monitoring security switches attached to access doors in the slot machine cabinet. Preferably, access violations result in suspension of game play and can trigger additional security operations to preserve the current state of game play. These circuits also function when power is off by use of a battery backup. In power-off operation, these circuits continue to monitor the access doors of the slot machine. When power is restored, the gaming machine can determine whether any security violations occurred while power was off, e.g., via software for reading status registers. This can trigger event log entries and further data authentication operations by the slot machine software.

Trusted memory devices are preferably included in an IGT gaming machine computer to ensure the authenticity of the software that may be stored on less secure memory subsystems, such as mass storage devices. Trusted memory devices and controlling circuitry are typically designed to not allow modification of the code and data stored in the memory device while the memory device is installed in the slot machine. The code and data stored in these devices may include authentication algorithms, random number generators, authentication keys, operating system kernels, etc. The purpose of these trusted memory devices is to provide gaming regulatory authorities a root trusted authority within the computing environment of the slot machine that can be tracked and verified as original. This may be accomplished via removal of the trusted memory device from the slot machine computer and verification of the secure memory device contents is a separate third party verification device. Once the trusted memory device is verified as authentic, and based on the approval of the verification algorithms contained in the trusted device, the gaming machine is allowed to verify the authenticity of additional code and data that may be located in the gaming computer assembly, such as code and data stored on hard disk drives. A few details related to trusted memory devices that may be used in the present invention are described in U.S. Pat. No. 6,685,567 from U.S. patent application Ser. No. 09/925,098, filed Aug. 8, 2001 and titled "Process Verification," which is incorporated herein in its entirety and for all purposes.

Mass storage devices used in a general purpose computer typically allow code and data to be read from and written to the mass storage device. In a gaming machine environment, modification of the gaming code stored on a mass storage device is strictly controlled and would only be allowed under specific maintenance type events with electronic and physical enablers required. Though this level of security could be provided by software, IGT gaming computers that include mass storage devices preferably include hardware level mass storage data protection circuitry that operates at the circuit level to monitor attempts to modify data on the mass storage device and will generate both software and hardware error triggers should a data modification be attempted without the proper electronic and physical enablers being present.

Returning to the examples of FIG. 14A or 14B, when a user wishes to play the gaming machine 1402, he or she may insert cash through the coin acceptor 1428 or bill validator 1430. Additionally, the bill validator may accept a printed ticket voucher which may be accepted by the bill validator 1430 as an indicium of credit when a cashless ticketing system is used. At the start of the game, the player may enter playing tracking information using the card reader 1424, the keypad 1422 and the florescent display 1416. Further, other game preferences of the player playing the game may be read from a card inserted into the card reader. During the game, the player views game information using the video display 1434. Other game and prize information may also be displayed in the video display screen 1442 located in the top box.

During the course of a game, a player may be required to make a number of decisions, which affect the outcome of the game. For example, a player may vary his or her wager on a particular game, select a prize for a particular game selected from a prize server, or make game decisions which affect the outcome of a particular game. The player may make these choices using the player-input switches 1432, the video display screen 1434 or using some other device which enables a player to input information into the gaming machine. In some embodiments, the player may be able to access various game services such as concierge services and entertainment content services using the video display screen 1434 and one more input devices.

During certain game events, the gaming machine 1402 may display visual and auditory effects that can be perceived by the player. These effects add to the excitement of a game, which makes a player more likely to continue playing. Auditory effects include various sounds that are projected by the speakers 1410, 1412, 1414 and/or 1450. Visual effects include flashing lights, strobing lights or other patterns displayed from lights on the gaming machine 1402 or from lights behind the belly glass 1440. After the player has completed a game, the player may receive game tokens from the coin tray 1438 or the ticket 1420 from the printer 1418, which may be used for further games or to redeem a prize. Further, the player may receive a ticket 1420 for food, merchandise, or games from the printer 1418.

Figure 15:
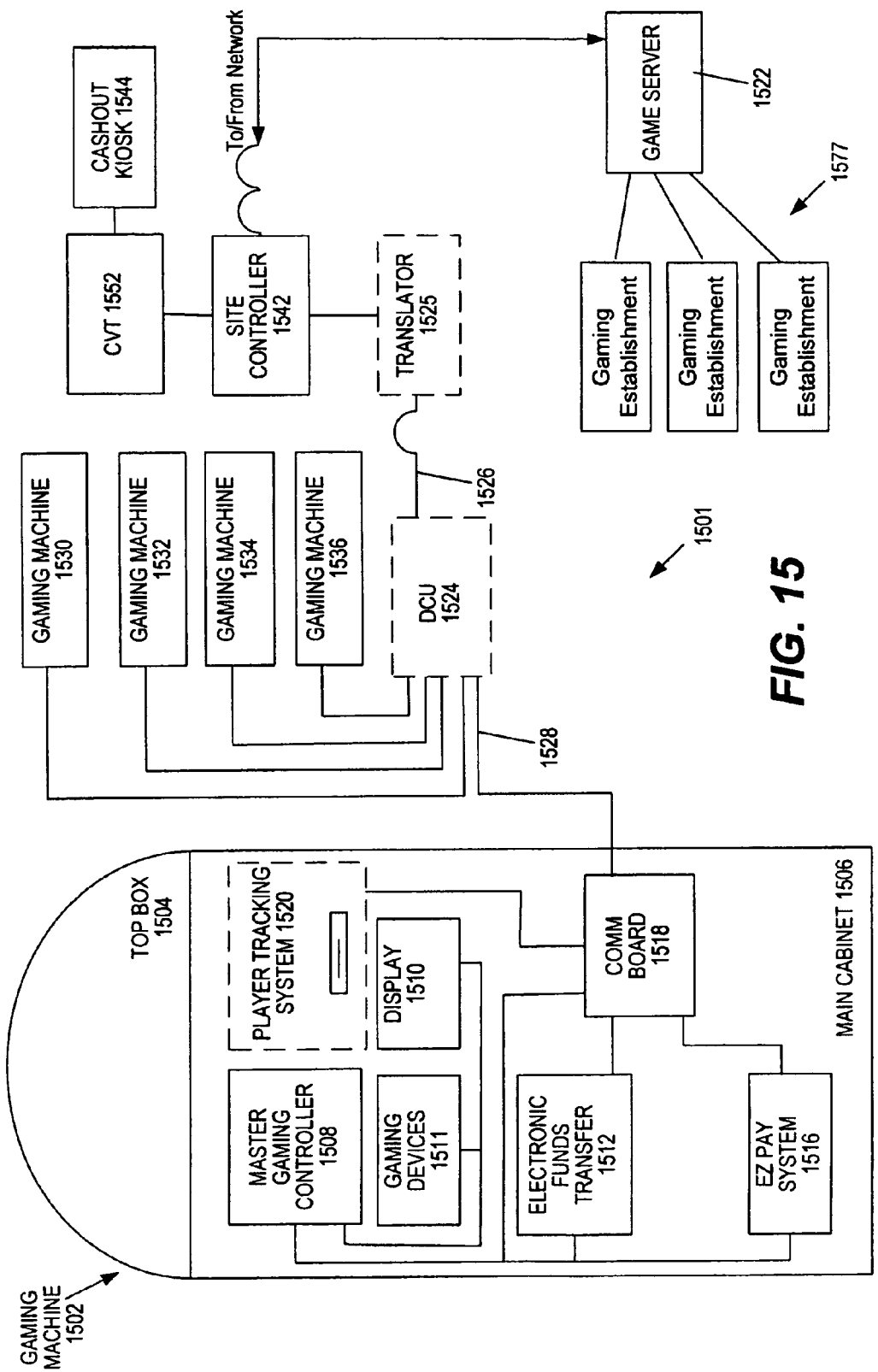
FIG. 15 illustrates a gaming network that may be used to implement some aspects of the invention.

Greater versatility may be obtained when gaming machines are part of a network. A simplified version of one such network is depicted in FIG. 15. Gaming establishment 1501 could be any sort of gaming establishment, such as a casino, a card room, an airport, a store, etc. In this example, gaming network 1577 includes more than one gaming establishment, all of which are networked to game server 1522. However, the present invention may be practiced with a variety of other network topologies, including but not limited to those described in U.S. patent application Ser. No. 11/225,407, entitled "METHODS AND DEVICES FOR MANAGING GAMING NETWORKS" and filed on Sep. 12, 2005, which is hereby incorporated by reference.

Here, gaming machine 1502, and the other gaming machines 1530, 1532, 1534, and 1536, include a main cabinet 1506 and a top box 1504. The main cabinet 1506 houses the main gaming elements and can also house peripheral systems, such as those that utilize dedicated gaming networks. The top box 1504 may also be used to house these peripheral systems.

The master gaming controller 1508 controls the game play on the gaming machine 1502 according to instructions and/or game data from game server 1522 or stored within gaming machine 1502 and receives or sends data to various input/output devices 1511 on the gaming machine 1502. In one embodiment, master gaming controller 1508 includes processor(s) and other apparatus of the gaming machines described above in FIGS. 6 and 7. The master gaming controller 1508 may also communicate with a display 1510.

A particular gaming entity may desire to provide network gaming services that provide some operational advantage. Thus, dedicated networks may connect gaming machines to host servers that track the performance of gaming machines under the control of the entity, such as for accounting management, electronic fund transfers (EFTs), cashless ticketing, such as EZPay™, marketing management, and data tracking, such as player tracking. Therefore, master gaming controller 1508 may also communicate with EFT system 1512, EZPay™ system 1516 (a proprietary cashless ticketing system of the present assignee), and player tracking system 1520. The systems of the gaming machine 1502 communicate the data onto the network 1522 via a communication board 1518.

It will be appreciated by those of skill in the art that embodiments of the present invention could be implemented on a network with more or fewer elements than are depicted in FIG. 15. For example, player tracking system 1520 is not a necessary feature of some implementations of the present invention. However, player tracking programs may help to sustain a game player's interest in additional game play during a visit to a gaming establishment and may entice a player to visit a gaming establishment to partake in various gaming activities. Player tracking programs provide rewards to players that typically correspond to the player's level of patronage (e.g., to the player's playing frequency and/or total amount of game plays at a given casino). Player tracking rewards may be free meals, free lodging and/or free entertainment. Moreover, player tracking information may be combined with other information that is now readily obtainable by an SBG system.

Moreover, DCU 1524 and translator 1525 are not required for all gaming establishments 1501. However, due to the sensitive nature of much of the information on a gaming network (e.g., electronic fund transfers and player tracking data) the manufacturer of a host system usually employs a particular networking language having proprietary protocols. For instance, 10-20 different companies produce player tracking host systems where each host system may use different protocols. These proprietary protocols are usually considered highly confidential and not released publicly.

Further, in the gaming industry, gaming machines are made by many different manufacturers. The communication protocols on the gaming machine are typically hard-wired into the gaming machine and each gaming machine manufacturer may utilize a different proprietary communication protocol. A gaming machine manufacturer may also produce host systems, in which case their gaming machine are compatible with their own host systems. However, in a heterogeneous gaming environment, gaming machines from different manufacturers, each with its own communication protocol, may be connected to host systems from other manufacturers, each with another communication protocol. Therefore, communication compatibility issues regarding the protocols used by the gaming machines in the system and protocols used by the host systems must be considered.

A network device that links a gaming establishment with another gaming establishment and/or a central system will sometimes be referred to herein as a "site controller." Here, site controller 1542 provides this function for gaming establishment 1501. Site controller 1542 is connected to a central system and/or other gaming establishments via one or more networks, which may be public or private networks. Among other things, site controller 1542 communicates with game server 1522 to obtain game data, such as ball drop data, bingo card data, etc.

In the present illustration, gaming machines 1502, 1530, 1532, 1534 and 1536 are connected to a dedicated gaming network 1522. In general, the DCU 1524 functions as an intermediary between the different gaming machines on the network 1522 and the site controller 1542. In general, the DCU 1524 receives data transmitted from the gaming machines and sends the data to the site controller 1542 over a transmission path 1526. In some instances, when the hardware interface used by the gaming machine is not compatible with site controller 1542, a translator 1525 may be used to convert serial data from the DCU 1524 to a format accepted by site controller 1542. The translator may provide this conversion service to a plurality of DCUs.

Further, in some dedicated gaming networks, the DCU 1524 can receive data transmitted from site controller 1542 for communication to the gaming machines on the gaming network. The received data may be, for example, communicated synchronously to the gaming machines on the gaming network.

Here, CVT 1552 provides cashless and cashout gaming services to the gaming machines in gaming establishment 1501. Broadly speaking, CVT 1552 authorizes and validates cashless gaming machine instruments (also referred to herein as "tickets" or "vouchers"), including but not limited to tickets for causing a gaming machine to display a game result and cash-out tickets. Moreover, CVT 1552 authorizes the exchange of a cashout ticket for cash. These processes will be described in detail below. In one example, when a player attempts to redeem a cash-out ticket for cash at cashout kiosk 1544, cash out kiosk 1544 reads validation data from the cashout ticket and transmits the validation data to CVT 1552 for validation. The tickets may be printed by gaming machines, by cashout kiosk 1544, by a stand-alone printer, by CVT 1552, etc. Some gaming establishments will not have a cashout kiosk 1544. Instead, a cashout ticket could be redeemed for cash by a cashier (e.g. of a convenience store), by a gaming machine or by a specially configured CVT.

Figure 16:
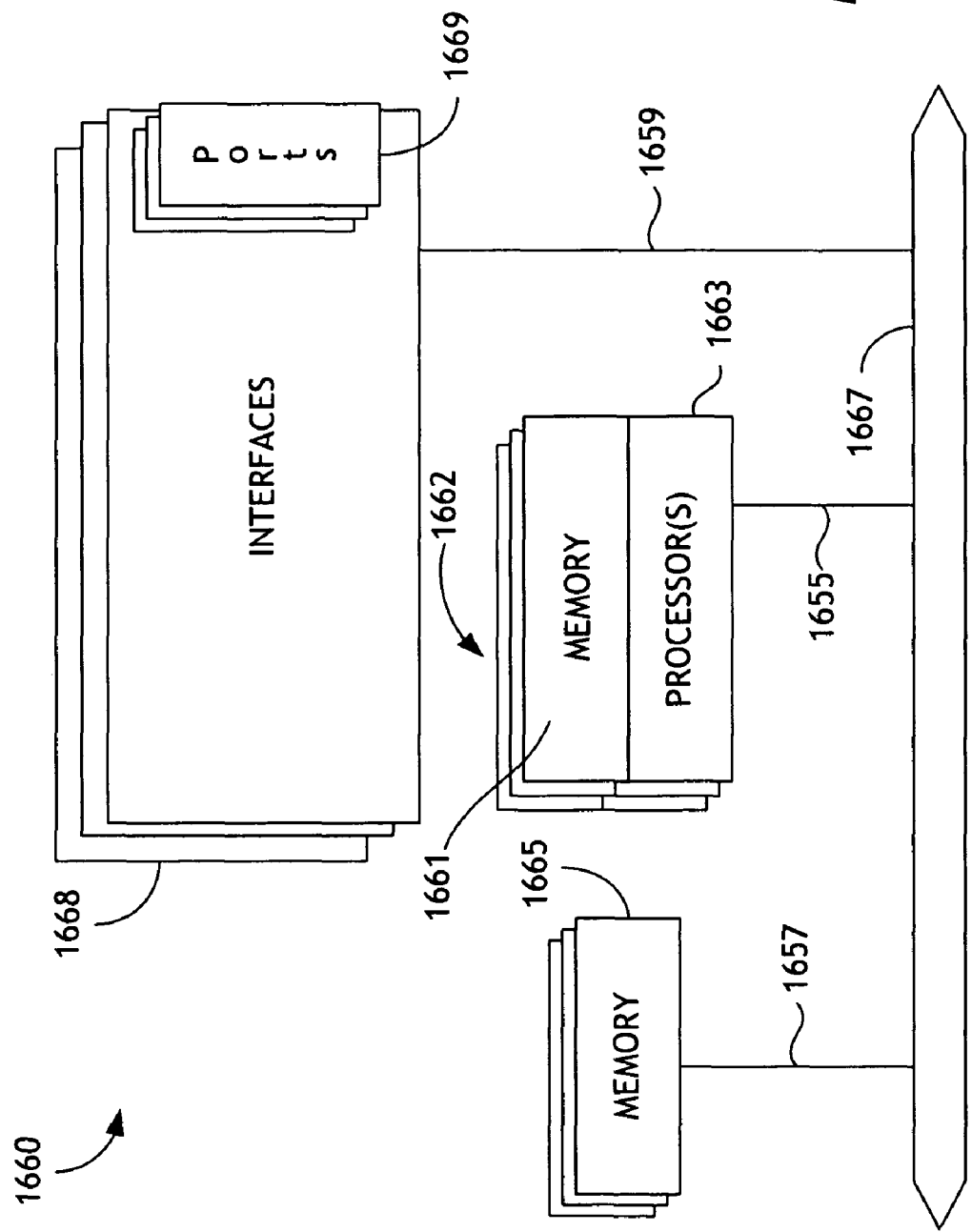
FIG. 16 illustrates a network device that may be used to implement some aspects of the invention.

FIG. 16 illustrates an example of a network device that may be configured for implementing some methods of the present invention. Network device 1660 includes a master central processing unit (CPU) 1662, interfaces 1668, and a bus 1667 (e.g., a PCI bus). Generally, interfaces 1668 include ports 1669 appropriate for communication with the appropriate media. In some embodiments, one or more of interfaces 1668 includes at least one independent processor and, in some instances, volatile RAM. The independent processors may be, for example, ASICs or any other appropriate processors. According to some such embodiments, these independent processors perform at least some of the functions of the logic described herein. In some embodiments, one or more of interfaces 1668 control such communications-intensive tasks as encryption, decryption, compression, decompression, packetization, media control and management. By providing separate processors for the communications-intensive tasks, interfaces 1668 allow the master microprocessor 1662 efficiently to perform other functions such as routing computations, network diagnostics, security functions, etc.

The interfaces 1668 are typically provided as interface cards (sometimes referred to as "linecards"). Generally, interfaces 1668 control the sending and receiving of data packets over the network and sometimes support other peripherals used with the network device 1660. Among the interfaces that may be provided are FC interfaces, Ethernet interfaces, frame relay interfaces, cable interfaces, DSL interfaces, token ring interfaces, and the like. In addition, various very high-speed interfaces may be provided, such as fast Ethernet interfaces, Gigabit Ethernet interfaces, ATM interfaces, HSSI interfaces, POS interfaces, FDDI interfaces, ASI interfaces, DHEI interfaces and the like.

When acting under the control of appropriate software or firmware, in some implementations of the invention CPU 1662 may be responsible for implementing specific functions associated with the functions of a desired network device. According to some embodiments, CPU 1662 accomplishes all these functions under the control of software including an operating system and any appropriate applications software.

CPU 1662 may include one or more processors 1663 such as a processor from the Motorola family of microprocessors or the MIPS family of microprocessors. In an alternative embodiment, processor 1663 is specially designed hardware for controlling the operations of network device 1660. In a specific embodiment, a memory 1661 (such as non-volatile RAM and/or ROM) also forms part of CPU 1662. However, there are many different ways in which memory could be coupled to the system. Memory block 1661 may be used for a variety of purposes such as, for example, caching and/or storing data, programming instructions, etc.

Regardless of network device's configuration, it may employ one or more memories or memory modules (such as, for example, memory block 1665) configured to store data, program instructions for the general-purpose network operations and/or other information relating to the functionality of the techniques described herein. The program instructions may control the operation of an operating system and/or one or more applications, for example.

Because such information and program instructions may be employed to implement the systems/methods described herein, the present invention relates to machine-readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media; and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, etc. Examples of program instructions include both machine code, such as produced by a compiler, and files containing higher-level code that may be executed by the computer using an interpreter.

Although the system shown in FIG. 16 illustrates one specific network device of the present invention, it is by no means the only network device architecture on which the present invention can be implemented. For example, an architecture having a single processor that handles communications as well as routing computations, etc. is often used. Further, other types of interfaces and media could also be used with the network device. The communication path between interfaces may be bus based (as shown in FIG. 16) or switch fabric based (such as a cross-bar).

While this invention is described in terms of preferred embodiments, there are alterations, permutations, and equivalents that fall within the scope of the invention. It should also be noted that there are many alternative ways of implementing the present invention.

For example, some implementations of the invention provide other options for players to control and/or customize gaming-related sounds. Some such implementations involve the determination, storage, retrieval and application of user sound preferences. The determination may be made according to a player's actions and/or according to a player's responses to prompts. In one such implementation, a player's sound settings from each session are saved and the same settings are applied for the player's next session. If, for example, a player has previously disabled a directional sound device, that preference would be saved and the directional sound device may be automatically disabled (if such a device is present) at the beginning of the player's next gaming session. Alternatively, the player could be prompted to determine whether to accept the previous settings, e.g., in this example the directional sound device being disabled. A player's volume settings may also be saved.

Other types of preference information may also be saved and retrieved during subsequent gaming sessions. A player may select customized sounds (e.g., as celebratory sounds), may choose to mute other sounds (e.g., to skip instruction sounds), etc. For example, a player may choose to have a few measures from a favorite song (e.g., "Back in Black," "We Are the Champions," etc.) reproduced as a celebratory sound.

Sound preference settings may be saved, for example, along with other player-related date in a player tracking database or a related database. However, sound preference settings need not be associated with a player tracking system and may be saved in other databases. In some implementations, sound preference settings may be stored on a portable storage device, such as a USB dongle or the like, and thereby provided to a gaming machine and/or a related audio system. Accordingly, player identification is not required for the storage and application of sound preference settings.

Moreover, other types of preferences may be saved. For example, a player may choose to have a digital image as an inset, as wallpaper, etc., whenever that player is playing at a gaming machine that enables such customization. The image may be an image of the player himself or herself, that of a family member or another loved one, an image relating to a hobby, etc.

Yet other implementations of the invention provide methods and devices for coordinating the audio output controlled by multiple logic devices (e.g., processors, sound cards, etc.) of a gaming machine, or associated with a gaming machine (e.g., in the vicinity of a gaming machine). For example, some logic devices may control sounds pertaining to a player tracking system (such as a logic device of player tracking system 1520 of FIG. 15), whereas other logic devices may control sounds relating to a wagering game (e.g., master gaming controller 1508 and/or one or more logic devices associated with gaming devices 1511). Still other logic devices may be involved in controlling a directional audio device (such as ultrasonic audio processor 1482 of FIG. 14C).

It may often be desirable to avoid having more than one instance of theme music, voice instructions, personal messages, and/or other sounds being reproduced at the same time. For example, it can be annoying to some players when advertisements are played during an exciting aspect of game play. Therefore, some implementations of the invention control one or more amplifiers (e.g., amplifier 1484 of FIG. 14C and/or audio amplifier 14 or FIG. 2) to temporarily mute sounds such as music, voice instructions, etc., from a player tracking system at certain times, e.g., when sounds are being reproduced in relation to a wagering game.

Figure 17:
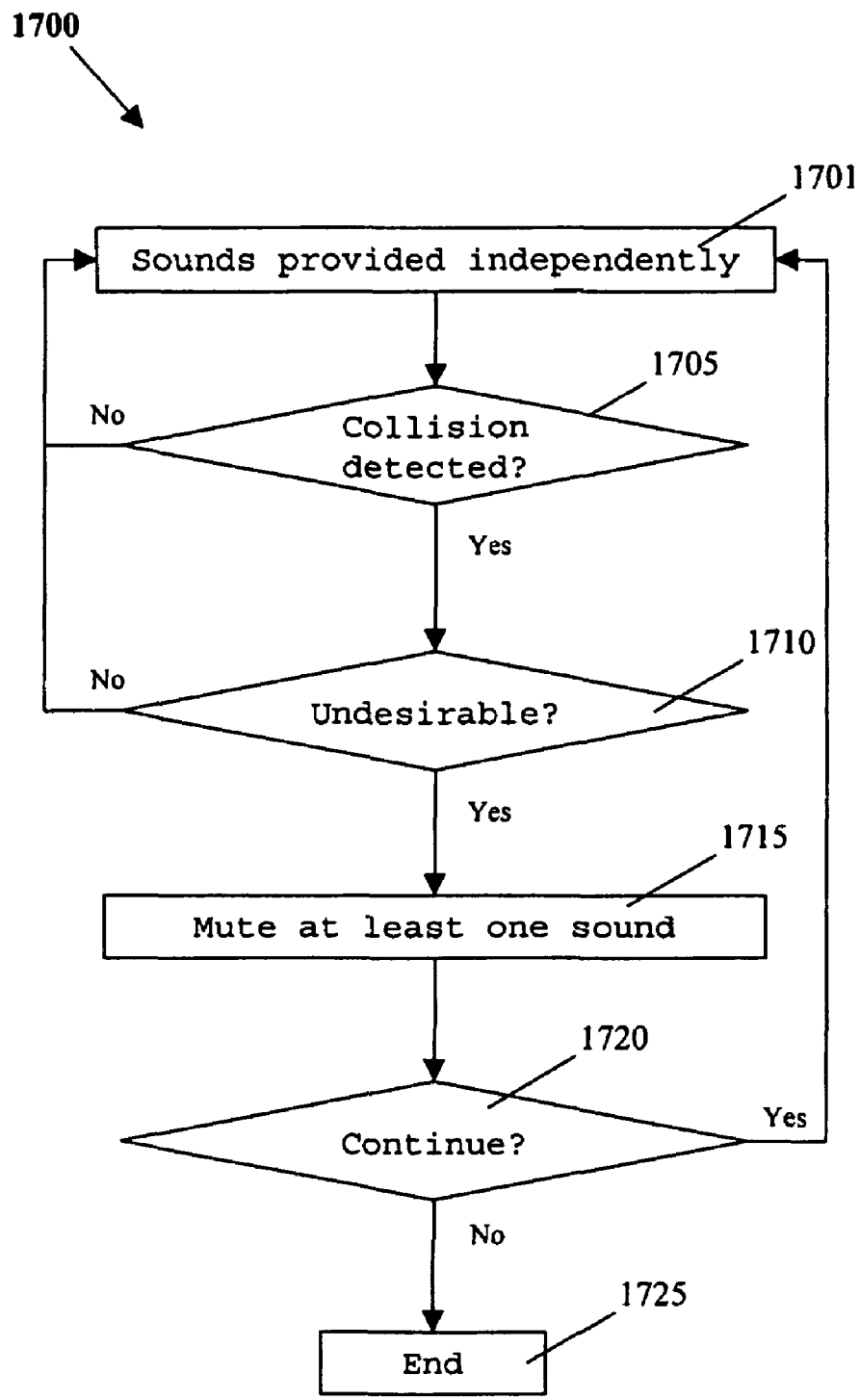
FIG. 17 is a flow chart that outlines a sound collision avoidance method of the invention.

FIG. 17 outlines one such method 1700 of the invention. In step 1701, various devices and/or features of a gaming machine are producing sounds independently. Such sounds may be produced that relate to game play, bonusing, player tracking, advertising, or other features. In some instances, the same sound-producing devices may be used, at least in part, to provide sounds for more than one device and/or software program. However, other sound-producing devices in the area, but not physically part of a gaming machine, may also be associated with game play, bonusing, tournaments, advertising, etc., and may be intended for a player of the gaming machine.

In step 1705, a master logic device (which may or may not be a master gaming controller) determines that there are at least two sound types that are scheduled to be provided according to different features of a gaming machine at or near the same time. Such an event may be referred to herein as a "collision" or the like. As with the other methods of the invention described herein, the steps of method 1700 are not necessarily performed in the order indicated. For example, step 1705 may be performed concurrently with, before or after step 1701.

If it is determined in step 1705 that there will be a collision, the process proceeds to step 1710, wherein the master logic device (or another logic device) determines (e.g., by reference to a rule set) whether it would be undesirable if the sounds were provided at the same time. If not, the sounds may be provided without modification and the process reverts back to step 1701.

If a collision would be undesirable, however, the master logic device applies the rule set to determine which sound has priority, which sound(s) to mute and to what extent. The master logic device will send a signal to an audio amplifier to mute at least one of the sounds. (Step 1715.) If it is determined in step 1720 that sounds of some type will continue to be produced, the process reverts to step 1701.

The rule to be applied in step 1710 may depend on what is happening at the time the determination is made, including but not limited to what the player is doing. If the player is interacting with a player tracking system (e.g., entering data) at the time the sound is scheduled to be produced, a rule may give priority to player tracking sounds. If the same sound is scheduled to be produced when the player is playing a game, a rule may give priority to game sounds.

In general, base game sounds will normally be considered more important to a player than advertisements, player tracking sounds, etc. However, a rule set may give some bonusing events priority over base game sounds. There could also be, for example, a "Lucky Coin" style bonus that could happen without reference to what is happening on a base wagering game. The bonus has its own sound features, which may include "jackpot" sounds or other such celebratory sounds. Such bonusing sounds may be given priority over base game sounds. Similarly, sounds related to a tournament may have priority over base game sounds.

In some implementations of the invention, events scheduled to take place on one gaming machine may affect sounds and other features that are presented on other gaming machines. For example, a rule may indicate that the sounds produced by all other gaming machines in an area will be partially or completely muted when a special event, e.g., a major bonusing or jackpot event, will occur on one of the gaming machines. For example, a local environment controller, such as that described in U.S. patent application Ser. No. 11/517,861, entitled "Casino Display Methods and Devices" (which has been incorporated herein by reference), may be used to control multiple gaming machines in this manner. Such an environment controller could also coordinate lighting effects, wall, ceiling, signage and/or floor displays, and other effects of the local environment.

It is therefore intended that the invention not be limited to the preferred embodiments described herein, but instead that the invention should be interpreted as including all such alterations, permutations, and equivalents as fall within the true spirit and scope of the present invention.

We claim:
1. A gaming machine, comprising:
   differentiating apparatus for differentiating first sounds intended for a first purpose for a first person currently using a gaming machine from second sounds intended for a second purpose for second persons who are not currently using the gaming machine wherein the first sounds and second sounds are provided according to the different purposes at substantially the same time;
   reproducing apparatus for reproducing the first sounds and the second sounds; and
   directional apparatus for directing the first sounds to a first area near one or more user interfaces of the gaming machine for the first purpose and for directing the second sounds to a second area different from the first area for the second purpose which is different from the first purpose wherein the first sounds are intended primarily for use by the first person currently using the gaming machine while the second sounds are intended primarily for the second persons not currently using the gaming machine.

2. The gaming machine of claim 1, further comprising:
an ambient noise level detector configured to detect an ambient noise level and to produce a detected ambient noise level signal; and
a dynamic volume controller configured to regulate a first volume of the first sounds in response to a detected ambient noise level signal.

3. The gaming machine of claim 1, wherein the reproducing apparatus comprises a device for producing ultrasonic waves that produce the first sounds via interaction with a medium.

4. The gaming machine of claim 1, wherein the reproducing apparatus comprises a device for producing a beam of ultrasonic waves that produces the first sounds via interaction with a medium.

5. The gaming machine of claim 1, wherein the reproducing apparatus comprises a sound dome.

6. The gaming machine of claim 1, wherein the reproducing apparatus comprises a speaker array.

7. The gaming machine of claim 1, wherein the differentiating apparatus comprises means for differentiating third sounds from the second sounds and the first sounds, the third sounds being equally intended for the first person and the second persons.

8. The gaming machine of claim 2, wherein the dynamic volume controller configured to regulate a second volume of the second sounds in response to the detected ambient noise level signal.

9. A gaming machine, comprising:
differentiating apparatus for differentiating and producing first sounds and second sounds wherein the first sounds are intended for a first purpose for a first person currently using a gaming machine while the second sounds are intended for a second purpose for a second person not currently using the gaming machine, and wherein the first sounds and second sounds are produced according to the different purposes at substantially the same time;
a directional audio device;
location-detecting apparatus for detecting a location of the first person or the second person;
controlling apparatus for controlling the directional audio device to direct sounds to the location of the first person or the second person, wherein the controlling comprises controlling a motor to change a direction towards which the sounds are directed according to the location detected by the location-detecting apparatus such that the first sounds are directed to a first location of the first person near one or more user interfaces of the gaming machine for the first purpose while the second sounds are directed to a second location of the second person different from the first location for the second purpose which is different from the first purpose and wherein the first sounds are intended primarily for use by the first person currently using the gaming machine while the second sounds are intended primarily by the second person not currently using the gaming machine; and
providing apparatus for providing a wagering game at the gaming machine.

10. The gaming machine of claim 9, wherein the location-detecting apparatus comprises a radio frequency identification ("RFID") reader.

11. The gaming machine of claim 9, wherein the second sounds comprise attraction sounds relating to the wagering game.

12. The gaming machine of claim 9, further comprising: creating apparatus for creating a correction signal that acts to negate unwanted sound, wherein the directional audio device is configured to create a noise-canceling beam based on the correction signal, wherein the location-detecting apparatus is configured for detecting a location of a player's head, and wherein the directional audio device is configured to direct the noise-canceling beam toward the player's head.

13. The gaming machine of claim 10, wherein the controlling apparatus controls the directional audio device to direct the second sounds towards the location of an RFID tag read by the RFID reader.

14. The gaming machine of claim 13, wherein the second sounds comprise a personalized message directed to a person associated with the RFID tag.

15. The gaming machine of claim 9, further comprising:
a first transmitter for transmitting the second sounds as first attraction messages at a first frequency; and
a second transmitter for transmitting the second sounds as second attraction messages at a second frequency.

16. The gaming machine of claim 15, wherein the first and second attraction messages correspond with first and second levels of a player tracking program.

17. A gaming method, comprising:
differentiating, by a gaming machine, first sounds intended for a first purpose for a first person currently using the gaming machine from second sounds intended for a second purpose for second persons who are not currently using the gaming machine;
reproducing, by the gaming machine, the first sounds and the second sounds according to the different purposes at substantially the same time;
directing, by the gaming machine, the first sounds to a first area near one or more input devices of the gaming machine for the first purpose; and
directing, by the gaming machine, the second sounds to a second area different from the first area for the second purpose which is different from the first purpose wherein the first sounds are intended for use by the first person currently using the gaming machine while the second sounds are intended for the second persons not currently using the gaming machine.

18. The gaming method of claim 17, further comprising:
detecting an ambient noise level; and
modulating the first volume according to the ambient noise level.

19. The gaming method of claim 17, wherein a second volume of the second sounds is higher than a first volume of the first sounds.

20. The gaming method of claim 17, wherein the first sounds comprise instruction sounds.

21. The gaming method of claim 17, wherein the second sounds comprise attraction sounds.

22. The gaming method of claim 17, further comprising:
differentiating third sounds from the second sounds and the first sounds, the third sounds being equally intended for the first person and the second persons; and
reproducing the third sounds by directing the third sounds to the first area and the second area.

23. The gaming method of claim 17, wherein the second sounds comprise game-winning sounds.

24. The gaming method of claim 18, further comprising modulating the second volume according to the ambient noise level.

25. The gaming method of claim 22, wherein the third sounds comprise game-winning sounds.

26. The gaming method of claim 17, wherein the first sounds are associated with game events of a wagering game and wherein the second sounds are not directly associated with the game events, the method further comprising:
   ascertaining when the first sounds and the second sounds are scheduled to be provided concurrently; and
   determining when the first sounds and the second sounds should not be provided concurrently.

27. The method of claim 26, further comprising the step of muting the first sounds or the second sounds when it is determined that the first sounds and the second sounds should not be provided concurrently.

28. The method of claim 27, wherein the second sounds comprise player tracking sounds, advertising sounds, bonusing sounds or tournament-related sounds.

* * * * *